(12) United States Patent
Hana et al.

(10) Patent No.: US 11,913,991 B2
(45) Date of Patent: Feb. 27, 2024

(54) ROTATING ELECTRIC MACHINE TEST METHOD, ROTATING ELECTRIC MACHINE TEST DEVICE, AND ROTATING ELECTRIC MACHINE

(71) Applicant: Mitsubishi Electric Corporation, Tokyo (JP)

(72) Inventors: Norihiko Hana, Tokyo (JP); Masao Akiyoshi, Tokyo (JP); Yoshihide Kikuichi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 452 days.

(21) Appl. No.: 17/278,669

(22) PCT Filed: Nov. 1, 2018

(86) PCT No.: PCT/JP2018/040697
§ 371 (c)(1),
(2) Date: Mar. 23, 2021

(87) PCT Pub. No.: WO2020/090082
PCT Pub. Date: May 7, 2020

(65) Prior Publication Data
US 2022/0034968 A1 Feb. 3, 2022

(51) Int. Cl.
*G01N 3/00* (2006.01)
*G01R 31/34* (2020.01)
(Continued)

(52) U.S. Cl.
CPC ............ *G01R 31/343* (2013.01); *G01B 5/30* (2013.01); *G01B 11/16* (2013.01); *G01L 1/24* (2013.01);
(Continued)

(58) Field of Classification Search
CPC ....... G01B 5/30; G01B 11/16; G01M 5/0033; G01L 1/24; H02K 1/22
See application file for complete search history.

(56) References Cited

U.S. PATENT DOCUMENTS

| 6,566,785 B1 | 5/2003 | Tong |
| 2016/0252464 A1 | 9/2016 | Ito et al. |
| 2017/0140519 A1* | 5/2017 | Burnside ................. F01D 17/04 |

FOREIGN PATENT DOCUMENTS

| CN | 105333832 A | 2/2016 |
| JP | 2008-232998 A | 10/2008 |
| WO | 2015/056790 A1 | 4/2015 |

OTHER PUBLICATIONS

Javad Bagersad, "Extracting full-field dynamic strain on a wind turbine rotor subjected to arbitrary excitations using 3D point tracking and a modal expansion technique", 2015 (Year: 2015).*

(Continued)

*Primary Examiner* — Maurice C Smith
(74) *Attorney, Agent, or Firm* — XSENSUS LLP

(57) ABSTRACT

A rotating electric machine includes a stator and a rotor. An imaging device images a test target portion which is a part of the rotor, to generate image data of the test target portion, and transmits the generated image data to an image processing device. The image processing device generates strain change information representing change in the strain distribution in the test target portion by digital image correlation on the basis of the test image data generated by the imaging device. The state of the rotor is tested using the generated strain change information.

15 Claims, 18 Drawing Sheets

(51) Int. Cl.
  *G06T 7/00*    (2017.01)
  *H02K 1/22*    (2006.01)
  *G01L 1/24*    (2006.01)
  *G01M 5/00*    (2006.01)
  *G01B 5/30*    (2006.01)
  *G01B 11/16*    (2006.01)

(52) U.S. Cl.
  CPC ............ *G01M 5/0033* (2013.01); *G01N 3/00* (2013.01); *G06T 7/001* (2013.01); *H02K 1/22* (2013.01); *G01N 2203/0062* (2013.01); *G06T 2207/30164* (2013.01)

(56) References Cited

OTHER PUBLICATIONS

Office Action dated Jun. 25, 2023, in corresponding Chinese patent Application No. 201880098956.6, 23 pages.
International Search Report and Written Opinion dated Feb. 5, 2019, received for PCT Application PCT/JP2018/040697 Filed on Nov. 1, 2018, 6 pages including English Translation.
Yoneyama et al., "Noncontact Deflection Distribution Measurement of Bridges Using Digital Image Correlation", Official Journal of JDNDI, vol. 55, No. 3, 2006, pp. 119-125.

\* cited by examiner

EMBODIMENT 1

EMBODIMENT 2

EMBODIMENT 3

EMBODIMENT 4

EMBODIMENT 5

EMBODIMENT 6

EMBODIMENT 7

EMBODIMENT 7

ROTATING ELECTRIC MACHINE TEST METHOD, ROTATING ELECTRIC MACHINE TEST DEVICE, AND ROTATING ELECTRIC MACHINE

CROSS-REFERENCE TO RELATED APPLICATION

The present application is based on PCT filing PCT/JP2018/040697, filed Nov. 1, 2018, the entire contents of which are incorporated herein by reference.

TECHNICAL FIELD

The present invention relates to a rotating electric machine test method, a rotating electric machine test device, and a rotating electric machine.

BACKGROUND ART

In a rotating electric machine such as an electric generator, a centrifugal force due to rotation is applied as stress to a rotor, and therefore aging deterioration of the rotor is concerned. In particular, a large-sized electric generator (e.g., turbine electric generator) as used in an electric power company has a huge rotor and the rotor is rotated at a high speed, so that extremely great stress is applied to the rotor. While such stress is repeatedly applied, the rotor might end up being broken.

In general, a rotor of a turbine electric generator includes a rotor core (iron core), a winding, and a retention ring, and the winding is stored in a slot formed in the rotor core and partially extends outward of the slot at an axial-direction end of the rotor core. For retaining the extending part of the winding, retention rings are attached at both ends of the rotor core.

The retention ring is firmly fixed to the rotor core by shrink fit or the like so that the retention ring is not detached from the rotor core by a centrifugal force. Therefore, stress is likely to occur in the retention ring. Various methods for reducing stress in the retention ring have been proposed. For example, in a turbine rotor described in Patent Document 1, in order to prevent a retention ring from moving in the axial direction relative to a rotor core, a lock key protruding in the radial direction is provided at an outer circumferential part of the rotor core, and a lock key groove for receiving the lock key is formed at an inner circumferential part of the retention ring. The shape and the dimensions of the lock key groove are set so that stress concentration on the retention ring is suppressed.

CITATION LIST

Patent Document

Patent Document 1: U.S. Pat. No. 6,566,785

SUMMARY OF THE INVENTION

Problems to be Solved by the Invention

Since extremely great stress is repeatedly applied to the rotor, the rotor is highly likely to end up being broken through successive usage, even in the case where some measures for suppressing stress concentration have been taken. Therefore, it is required that the state of the rotor is regularly tested and appropriate measures such as repair or part replacement are conducted before the rotor is broken. Conventionally, rotating electric machines are disassembled and subjected to tests on a part-by-part basis, so that there is a problem that a lot of time and cost are required.

The present invention has been made to solve the above problem, and an object of the present invention is to obtain a rotating electric machine test method, a rotating electric machine test device, and a rotating electric machine that enable the state of a rotor to be efficiently tested in a short time.

Solution to the Problems

A rotating electric machine test method according to the present invention is a test method for testing a rotating electric machine including a rotor and a stator, and includes: a test image data acquisition step of acquiring test image data by imaging a test target portion which is a part of the rotor by an imaging device; and a change information generation step of generating, as strain change information, change in a strain distribution in the test target portion by digital image correlation on the basis of the acquired test image data.

Effect of the Invention

In the rotating electric machine test method according to the present invention, change in the strain distribution in the test target portion is generated as strain change information from the test image data by digital image correlation. Thus, it becomes possible to efficiently test the state of the rotor in a short time, using the strain change information, without disassembling the rotating electric machine.

DESCRIPTION OF EMBODIMENTS

Hereinafter, a rotating electric machine test method, a rotating electric machine test device, and a rotating electric machine according to embodiments of the present invention will be described with reference to the drawings.

Embodiment 1

Figure 1:
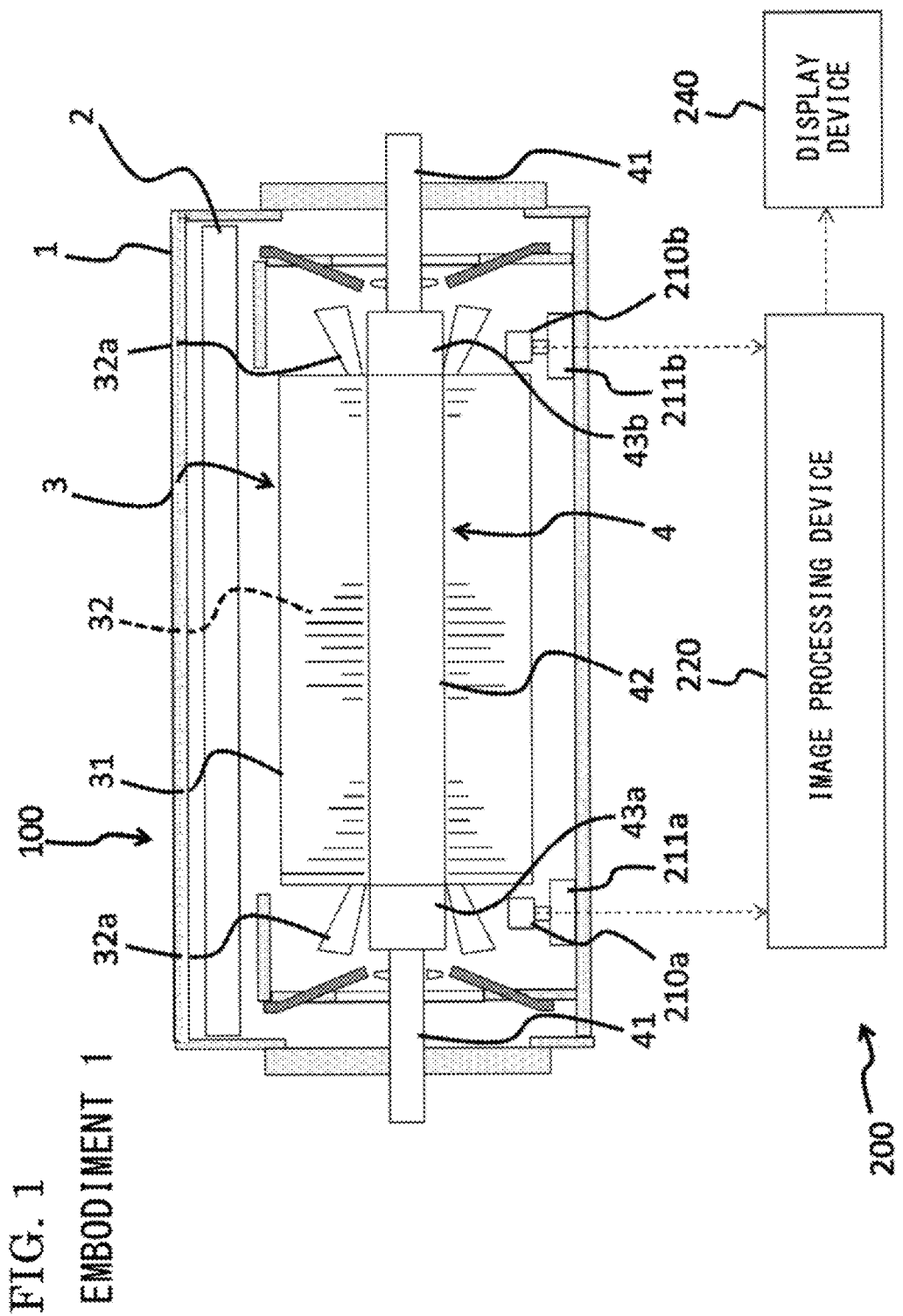
FIG. 1 is a schematic diagram showing a test device and a rotating electric machine in embodiment 1.

FIG. 1 is a schematic diagram showing the entire configuration including a test device according to embodiment 1 of the present invention and a rotating electric machine which is a test target of the test device. The rotating electric machine according to embodiment 1 is a turbine electric generator which obtains a rotational force from a turbine as a prime mover.

As shown in FIG. 1, a rotating electric machine 100 includes a frame 1, and a gas cooler 2, a stator 3, and a rotor 4 which are stored in the frame 1. A refrigerant (e.g., cooling gas) for removing heat generated through electric generation is circulated in the frame 1, and the gas cooler 2 cools the refrigerant. The stator 3 includes a stator core (stator iron core) 31 and a stator winding 32. The stator core 31 has a cylindrical shape and is fixedly provided in the frame 1. The stator core 31 has a plurality of slots (grooves) at the inner circumferential part thereof. The stator winding 32 is stored as an armature winding in each slot of the stator core 31. A part of the stator winding 32 is led out from both ends of the stator core 31 to form coil ends 32a. One of the coil ends 32a is connected to a main lead (not shown) extending to the outside of the frame 1. Through the main lead, generated power is extracted from the rotating electric machine 100 to the outside.

The rotor 4 includes a pair of rotary shafts 41, a rotor core (iron core) 42, and retention rings 43a, 43b. The pair of rotary shafts 41 are provided on both sides across the rotor core 42. The axes of the pair of rotary shafts 41 and the axis of the rotor core 42 coincide with each other. Hereinafter, a direction parallel to the axis of the pair of rotary shafts 41 and the rotor core 42 is referred to as axial direction. In addition, a radial direction about the axis of the pair of rotary shafts 41 and the rotor core 42 is simply referred to as radial direction, and a circumferential direction about the axis of the pair of rotary shafts 41 and the rotor core 42 is simply referred to as circumferential direction.

The pair of rotary shafts 41 are rotatably supported by bearings provided to the frame 1. The rotor 4 is rotated relative to the stator 3 by the prime mover (not shown; in this example, a turbine). The stator core 31 and the stator winding 32 are located radially outward of the rotor core 42, and by receiving a magnetic flux generated from the rotor core 42, current is generated in the stator winding 32. The retention rings 43a, 43b are respectively attached to one end and another end of the rotor core 42, and are exposed outside the stator core 31.

A test device 200 includes imaging devices 210a, 210b, driving mechanisms 211a, 211b, an image processing device 220, and a display device 240. The imaging devices 210a, 210b are placed in the frame 1 of the rotating electric machine 100. The imaging devices 210a, 210b image test target portions which are parts of the rotor 4 to generate image data of the test target portions, and transmit the generated image data to the image processing device 220. The driving mechanisms 211a, 211b move the imaging devices 210a, 210b in the frame 1.

In the present embodiment, the test target portions are set at the retention rings 43a, 43b. The imaging device 210a is provided near the retention ring 43a, and images the retention ring 43a while being moved by the driving mechanism 211a. The imaging device 210b is provided near the retention ring 43b, and images the retention ring 43b while being moved by the driving mechanism 211b.

The imaging devices 210a, 210b image the retention rings 43a, 43b in a specific initial period, and transmit the generated image data as initial image data to the image processing device 220. The initial period is, for example, a period after the rotating electric machine 100 is manufactured and before operation of the rotating electric machine 100 is started. After operation of the rotating electric machine 100 is started, the imaging devices 210a, 210b image the retention rings 43a, 43b in a predetermined test period, and transmit the generated image data as test image data to the image processing device 220. The test period is, for example, set so as to come at regular intervals after operation of the rotating electric machine 100 is started. Alternatively, the test period may be set so that the intervals of the test periods are gradually shortened as the time elapses after operation of the rotating electric machine 100 is started. Still alternatively, the test period may be set on the basis of an actual operation time of the rotating electric machine 100, instead of a mere elapsed time. In addition, stress applied to the rotor 4 depends on the number of revolutions, the rotation speed, the rotational acceleration of the rotor 4, and the like. Therefore, the test period may be set on the basis of at least one of the number of revolutions, the rotation speed, and the rotational acceleration of the rotor 4. Alternatively, since the deterioration speed of the rotor 4 differs depending on the temperature or the humidity in the frame 1, the test period may be set on the basis of the temperature or the humidity in the frame 1. It is noted that the initial period corresponds to a first period in the claims and the test period corresponds to a second period in the claims.

In this example, imaging of the retention rings 43a, 43b by the imaging devices 210a, 210b is performed in a state in which the rotor 4 is rotated at a low speed by the prime mover. For example, each of the imaging devices 210a, 210b includes a strobe light source and an imaging element, and the imaging element performs imaging while the strobe light source emits light in synchronization with rotation of the rotor 4. In this case, it is possible to image the entireties in the circumferential direction of the retention rings 43a, 43b without moving the imaging devices 210a, 210b in the circumferential direction. Therefore, the configurations of the driving mechanisms 211a, 211b can be simplified.

The image processing device 220 generates change in the strain distribution in the test target portions as strain change information by digital image correlation, on the basis of the test image data generated by the imaging devices 210a, 210b. The digital image correlation is a method of imaging the surface of an object before and after deformation of the object, and then, on the basis of the brightness distribution of the obtained digital image data, calculating a displacement amount and a displacement direction of the surface of the object at the same time. The strain change information includes a displacement amount and a displacement direction at the test target portion. The display device 240 displays various information generated by the image processing device 220.

Figure 2:
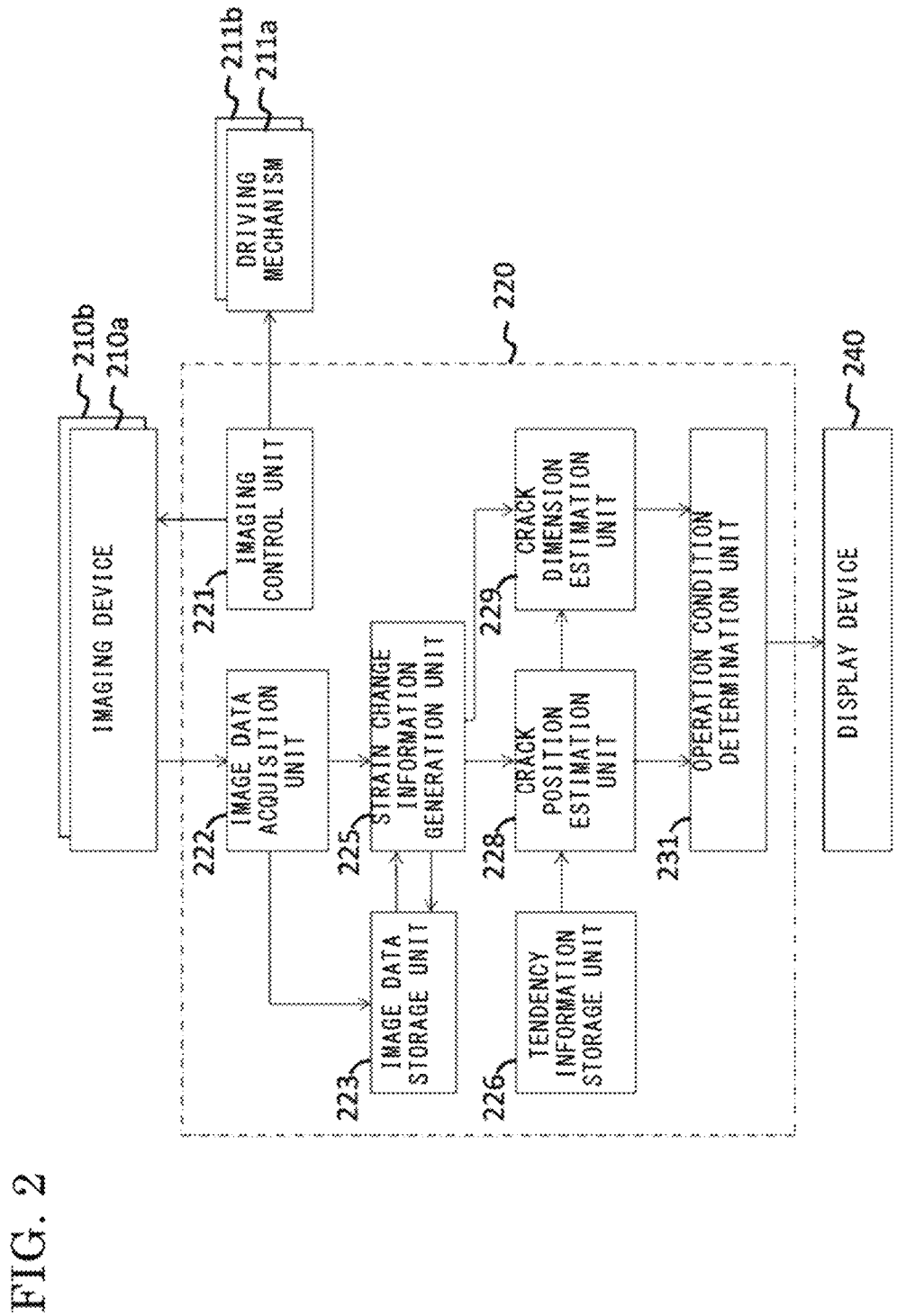
FIG. 2 is a block diagram showing a functional configuration of an image processing device in embodiment 1.

FIG. 2 is a block diagram showing a functional configuration of the image processing device 220. As shown in FIG. 2, the image processing device 220 includes an imaging control unit 221, an image data acquisition unit 222, an image data storage unit 223, a strain change information generation unit 225, a tendency information storage unit 226, a crack position estimation unit 228, a crack dimension estimation unit 229, and an operation condition determination unit 231.

The imaging control unit 221 controls the imaging devices 210a, 210b and the driving mechanisms 211a, 211b so as to image the test target portions in the initial period and the test period described above. The image data acquisition unit 222 acquires initial image data transmitted from the imaging devices 210a, 210b, and outputs the initial image data to the image data storage unit 223. In addition, the image data acquisition unit 222 acquires test image data transmitted from the imaging devices 210a, 210b, and outputs the test image data to the image data storage unit 223 and the strain change information generation unit 225.

The image data storage unit 223 stores the initial image data and the test image data given from the image data acquisition unit 222. The strain change information generation unit 225 generates strain change information about the retention rings 43a, 43b by digital image correlation on the basis of the test image data given from the image data acquisition unit 222.

Specifically, the strain change information generation unit 225 compares the initial image data stored in the image data storage unit 223 with the test image data given from the image data acquisition unit 222, and on the basis of the difference therebetween, generates strain change information representing change in the strain distribution in the test target portion during a period from the initial period to the present time. The strain change information generation unit 225 outputs the generated strain change information to the crack position estimation unit 228.

Every time the test period comes, the strain change information generation unit 225 may compare the test image data in the last test period stored in the image data storage unit 223 with the test image data in the present test period given from the image data acquisition unit 222, and on the basis of the difference therebetween, may generate strain change information representing change in the strain distribution in the test target portion during a period (hereinafter, referred to as operation period) from the last test period to the present test period. In this case, it is possible to calculate the degree (hereinafter, referred to as strain change degree) of change in the strain distribution during each operation period, on the basis of the strain change information for each test period. Abnormality determination for the rotor 4 may be performed on the basis of the strain change degree. For example, in the case where a difference between the strain change degree in the last operation period and the strain change degree in the present operation period exceeds a prescribed value, it may be determined that abnormality has occurred in the rotor 4, and a notification thereof may be issued to a worker.

The image processing device 220 may further include a strain change information storage unit for storing the strain change information generated in each test period. In this case, it is possible to perform abnormality determination on the basis of comparison among plural pieces of strain change information in the plurality of test periods.

The tendency information storage unit 226 stores tendency information representing the tendency of change in the strain distribution in the test target portion in the case where crack has occurred in the rotor 4. The tendency information indicates the correspondence relationship between the position of the crack occurring in the rotor 4 and the strain distribution in the rotor 4, and is generated on the basis of actual measurements, simulation, or the like. Here, the crack is an example of damage in the rotor 4, and includes a chip and a fissure. The crack position estimation unit 228 estimates a position (hereinafter, referred to as crack position) where the crack has occurred in the rotor 4, on the basis of the strain change information given from the strain change information generation unit 225 and the tendency information stored in the tendency information storage unit 226. In this case, the crack position estimation unit 228 can estimate the crack position through inverse analysis using the strain change information.

In this example, the tendency information includes plural pieces of distribution information. The plural pieces of distribution information correspond to a plurality of different parts of the rotor 4. Each piece of distribution information represents the strain distribution in the test target portion in the case where crack has occurred at the corresponding part. The crack position estimation unit 228 estimates the crack position on the basis of comparison of the strain change information and the plural pieces of distribution information. The crack position estimation unit 228 outputs the estimated crack position to the crack dimension estimation unit 229 and the operation condition determination unit 231.

The crack dimension estimation unit 229 estimates the dimension of the crack (hereinafter, referred to as crack dimension) at the crack position estimated by the crack position estimation unit 228, on the basis of the strain change information given from the strain change information generation unit 225. In this case, the crack dimension estimation unit 229 can estimate the crack dimension through inverse analysis using the strain change information. The crack dimension estimation unit 229 outputs the estimated crack dimension to the operation condition determination unit 231.

The operation condition determination unit 231 determines an appropriate operation condition for the rotating electric machine 100 on the basis of the crack position estimated by the crack position estimation unit 228 and the crack dimension estimated by the crack dimension estimation unit 229, and outputs the determined operation condition to the display device 240. The operation condition includes a time (hereinafter, referred to as operation possible time) during which the rotating electric machine 100 can continue its operation, and an appropriate rotation speed (hereinafter, referred to as appropriate speed) of the rotor 4. In this case, the operation condition determination unit 231 can calculate the operation possible time and the appropriate speed from the crack position and the crack dimension by a known method based on material property and fracture mechanics.

Since stress applied to the rotor 4 depends on the rotation speed of the rotor 4, stress applied to the rotor 4 can be reduced by restricting the rotation speed of the rotor 4. The operation possible time is a period as a reference for a timing when repair or part replacement should be performed, and is a period during which the rotating electric machine 100 can be stably operated from the start of the operation in the case where the rotor 4 is rotated at the appropriate speed.

The display device 240 displays the operation condition given from the operation condition determination unit 231. The worker adjusts the rotation speed of the rotor 4 to the appropriate speed on the basis of the display on the display device 240, whereby it is possible to prolong the life of the rotating electric machine 100 even though the rotation speed is restricted. In addition, the worker can perform repair or part replacement at an appropriate timing on the basis of the displayed operation possible time.

The operation condition determination unit 231 may output the determined appropriate speed to a control device (not shown) for controlling the rotation speed of the rotor 4. In this case, the rotation speed of the rotor 4 can be automatically adjusted to the appropriate speed by the control device. In addition, the operation condition determination unit 231 may output the determined operation possible time to an alarm device (not shown). In this case, when the operation time of the rotating electric machine 100 becomes close to or reaches the operation possible time, the alarm device issues an alarm (e.g., alarm buzzer). Thus, the worker can easily recognize the timing when repair or part replacement should be performed.

At least one of the strain change information generated by the strain change information generation unit 225, the crack position estimated by the crack position estimation unit 228, and the crack dimension estimated by the crack dimension estimation unit 229 may be displayed by the display device 240. In this case, the worker can acquire various information by looking at the display on the display device 240.

The details of the rotor 4 will be described. Here, for clarifying the positional relationship of parts in a plurality of drawings, X direction, Y direction, and Z direction which are perpendicular to each other are defined, and arrows representing the X direction, the Y direction, and the Z direction are shown in the drawings. The X direction corresponds to the above axial direction, and the Y direction and the Z direction correspond to the above radial direction.

Figure 3:
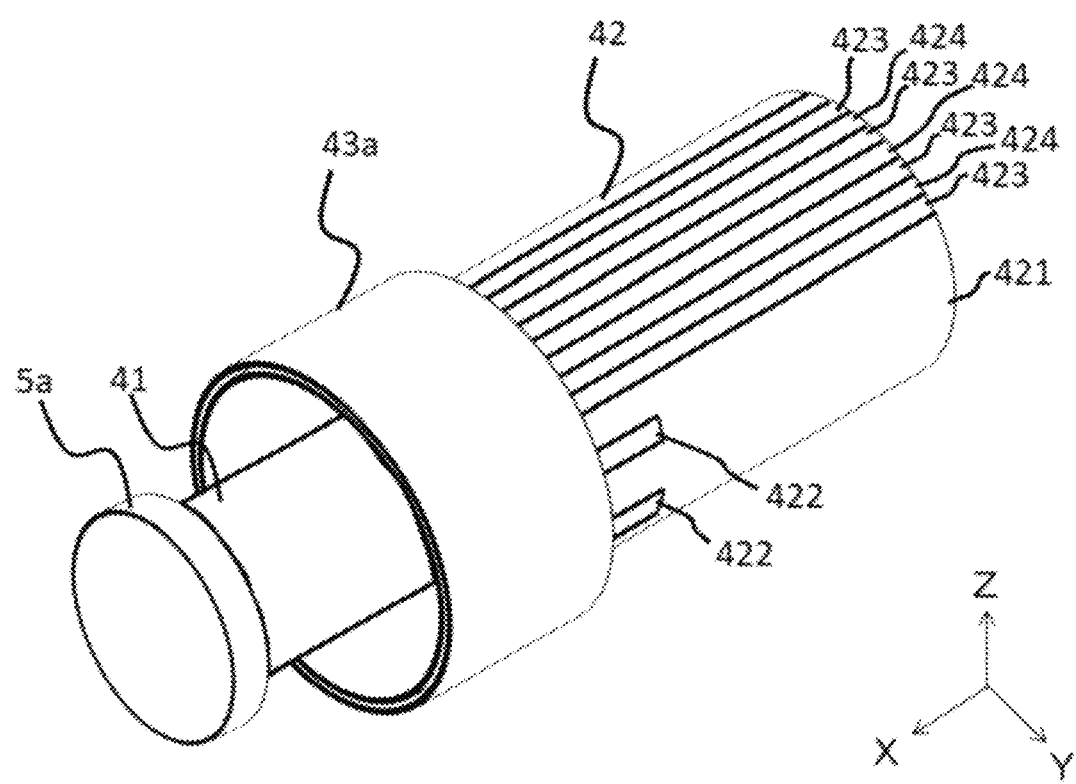
FIG. 3 is an external perspective view of a retention ring and the surrounding part thereof in embodiment 1.

Hereinafter, mainly, the structures of the retention ring 43a and the surrounding part thereof will be described. The retention ring 43b and the surrounding part thereof have the same structures as the retention ring 43a and the surrounding part thereof. FIG. 3 is an external perspective view of the retention ring 43a and the surrounding part thereof. As shown in FIG. 3, the rotary shaft 41 has a flange portion 5a at one end thereof. A rotary shaft of the prime mover (turbine) is connected to the flange portion 5a. As described above, the rotor core 42 is coaxial with the rotary shaft 41 and extends in the axial direction. The retention ring 43a has a cylindrical shape and is provided so as to surround a connection part between the rotor core 42 and the rotary shaft 41. The rotor core 42 has, at the outer circumference thereof, a pair of magnetic pole portions 421, a plurality of slots 423, and a plurality of coming-off prevention portions 424, which extend in the axial direction. In FIG. 3, of the pair of magnetic pole portions 421, only one magnetic pole portion 421 is shown. Each magnetic pole portion 421 has a plurality of air passages 422 extending in the axial direction.

Figure 4:
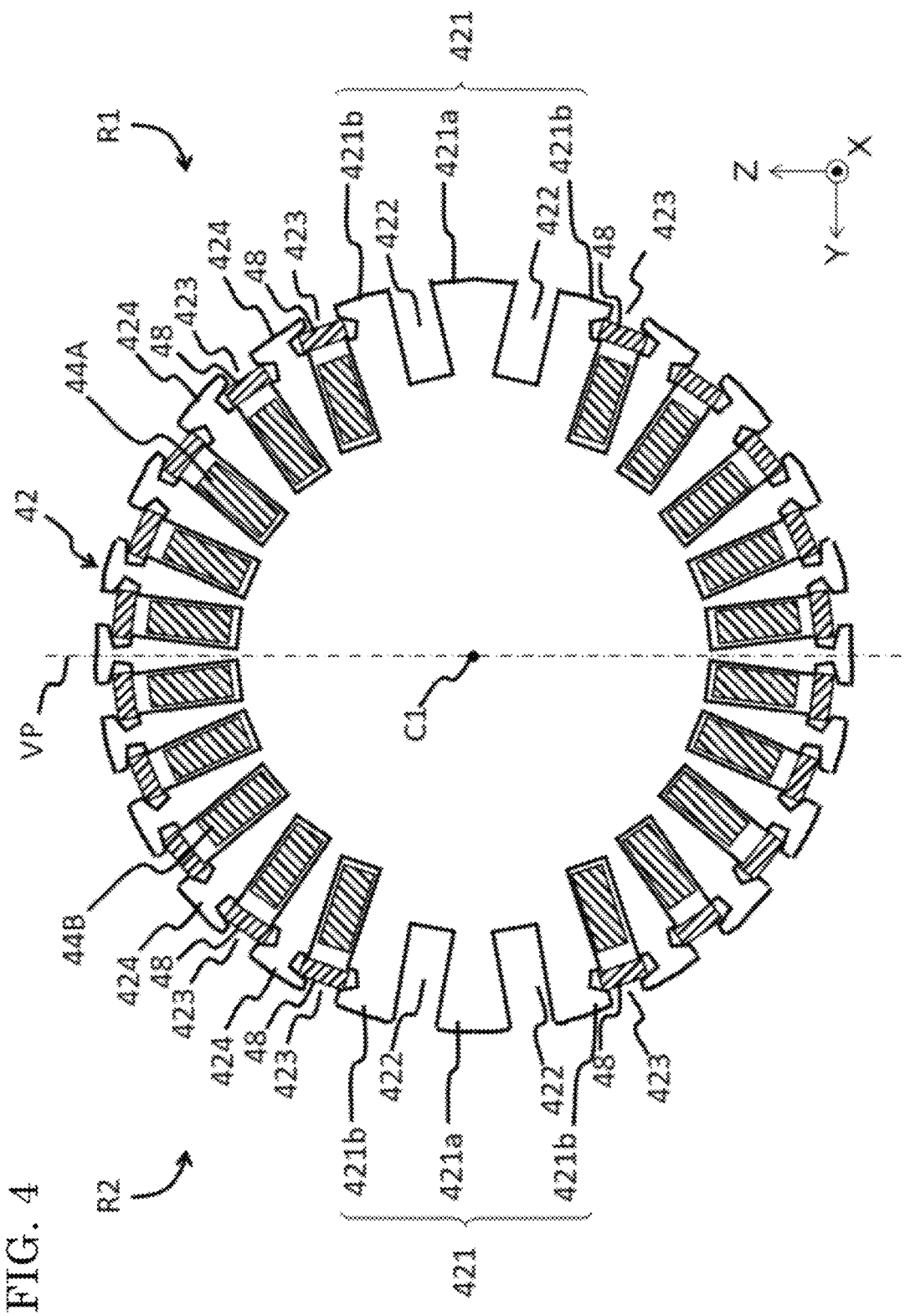
FIG. 4 is a sectional view of a rotor core in embodiment 1.

FIG. 4 is a sectional view of the rotor core 42. The cross-section in FIG. 4 is a cross-section perpendicular to the axial direction (hereinafter, referred to as axis perpendicular cross-section). As shown in FIG. 4, along the circumferential direction, continuous recesses and protrusions are formed at the outer circumference of the axis perpendicular cross-section of the rotor core 42. In the axis perpendicular cross-section, the air passages 422 and the slots 423 have recessed shapes. Specifically, the air passages 422 and the slots 423 have groove shapes extending in the axial direction. The plurality of air passages 422 and slots 423 are formed so as to be separated from each other in the circumferential direction.

Each magnetic pole portion 421 includes a magnetic pole center portion 421a and a pair of magnetic pole end portions 421b. In the circumferential direction, the pair of magnetic pole end portions 421b are provided on both sides of the magnetic pole center portion 421a. The plurality of air passages 422 are provided between the magnetic pole center portion 421a and the pair of magnetic pole end portions 421b. Specifically, a pair of air passages 422 extend by a predetermined length from one end toward the center side of each magnetic pole portion 421, and a pair of air passages 422 extend by a predetermined length from the other end toward the center side of each magnetic pole portion 421. Gas after cooling rotor coil ends (both ends of rotor windings 44A, 44B described later) is discharged through the air passages 422.

Here, a virtual plane VP passing an axis Cl of the rotor core 42 and parallel to the axial direction is defined. The outer circumferential part of the rotor core 42 includes a region R1 and a region R2 with the virtual plane VP as a boundary. One magnetic pole portion 421 is provided at the center of the region R1 in the circumferential direction, and the other magnetic pole portion 421 is provided at the center of the region R2 in the circumferential direction. The plurality of slots 423 and the plurality of coming-off prevention portions 424 are provided so as to be arranged alternately between the pair of magnetic pole portions 421 in the circumferential direction. The rotor winding 44A as a field winding is stored in the plurality of slots 423 in the region R1. The rotor winding 44B as a field winding is stored in the plurality of slots 423 in the region R2.

In the respective slots 423, wedges 48 are provided radially outward of the rotor windings 44A, 44B. Each coming-off prevention portion 424 has a hook-shaped end portion to latch the wedge 48. Thus, the rotor windings 44A, 44B are prevented from coming off the slots 423 by a centrifugal force. The width of each magnetic pole portion 421 in the circumferential direction is set to be greater than the width of each coming-off prevention portion 424 in the circumferential direction. By setting the width of the coming-off prevention portions 424 to be comparatively small, the number of turns of the rotor windings 44A, 44B can be appropriately set. In addition, by setting the width of the magnetic pole portions 421 to be comparatively great, a magnetic flux generated from the rotor core 42 can be appropriately adjusted. In this example, the widths of the magnetic pole center portion 421a and the magnetic pole end portions 421b in the circumferential direction are greater than the width of each coming-off prevention portion 424 in the circumferential direction.

Figure 5:
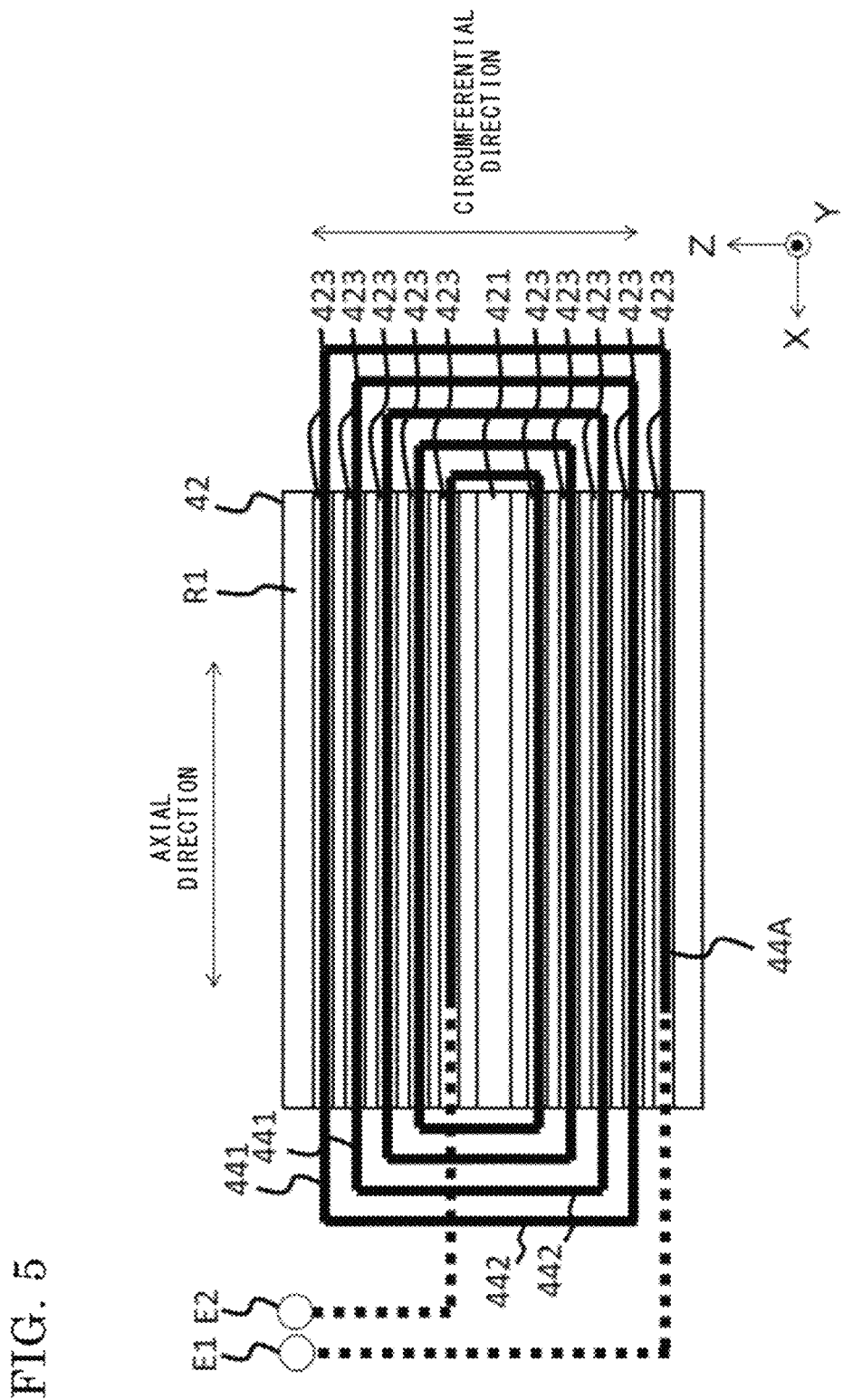
FIG. 5 is a schematic diagram illustrating the relationship between slots and a rotor winding in embodiment 1.

FIG. 5 is a schematic diagram illustrating the relationship between the slots 423 and the rotor winding 44A provided in the region R1. In FIG. 5, the region R1 and the rotor winding 44A are shown in a planar manner. In FIG. 5, the horizontal direction corresponds to the axial direction (X direction), and the vertical direction corresponds to the circumferential direction. The slots 423 and the rotor winding 44B provided in the region R2 have the same configuration as the slots 423 and the rotor winding 44A shown in FIG. 5.

As shown in FIG. 5, the rotor winding 44A has a plurality of line-shaped portions 441 extending in the axial direction and a plurality of line-shaped portions 442 extending in the circumferential direction, and is provided integrally so as to be shaped spirally around the magnetic pole portion 421. The plurality of line-shaped portions 441 are respectively stored in the plurality of slots 423 in the region R1, and extend axially outward of the plurality of slots 423. The plurality of line-shaped portions 442 are located on the axially outer sides of the plurality of slots 423. One end E1 and another end E2 of the rotor winding 44A are led axially outward of the rotor core 42 through internal paths provided in the rotor core 42, and are connected to an exciter (not shown).

Figure 6:
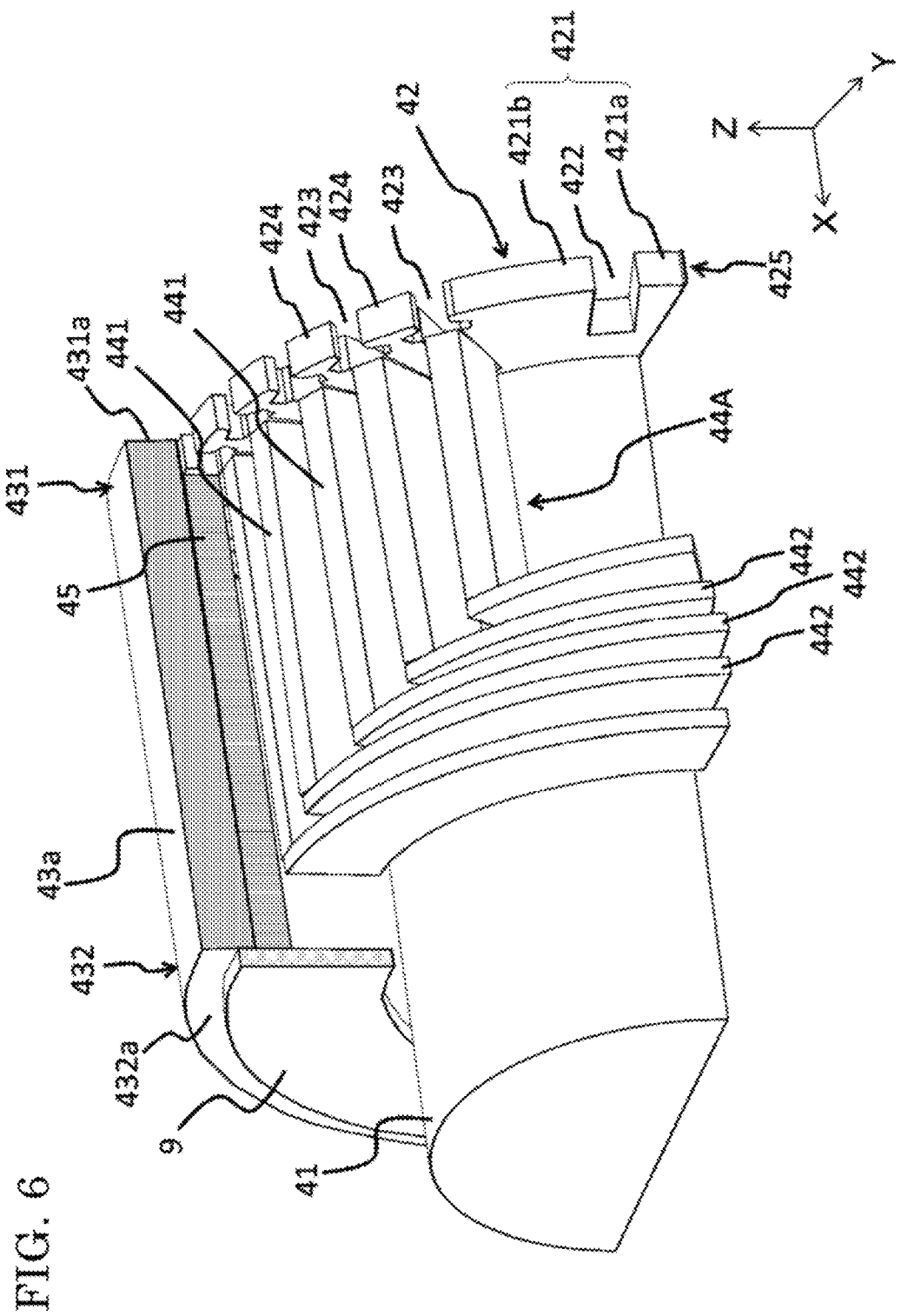
FIG. 6 is a cutaway perspective view of the retention ring and the surrounding part thereof in embodiment 1.

FIG. 6 is a cutaway perspective view of the retention ring 43a and the surrounding part thereof. In FIG. 6, the magnetic pole portion 421, the air passage 422, the slots 423, and the coming-off prevention portions 424 are shown at only end portions thereof. Each line-shaped portion 441 of the rotor winding 44A extends axially outward from an end of the slot 423, to be connected to the line-shaped portion 442. The retention ring 43a is provided so as to cover the part of the rotor winding 44A that extends outward of the slot 423. A cylindrical insulating member 45 is provided between the retention ring 43a and the rotor winding 44A on the axially outer side of the slots 423. One end of the retention ring 43a is joined to ends of the magnetic pole portions 421 and the plurality of coming-off prevention portions 44.

Hereinafter, one end and the other end of the retention ring 43a are referred to as core-side end 431 and plate-side end 432, respectively. In addition, ends of the magnetic pole portions 421 and the plurality of coming-off prevention portions 44 to which the core-side end 431 of the retention ring 43a is joined, are referred to as attachment portion 425. The width of the core-side end 431 in the axial direction is equal to the width of the attachment portion 425 of the rotor core 42 in the axial direction, and the core-side end 431 and the attachment portion 425 overlap each other in the radial direction. The plate-side end 432 of the retention ring 43a is located radially outward of the rotary shaft 41. The core-side end 431 corresponds to a first end in the claims, and the plate-side end 432 corresponds to a second end in the claims.

The core-side end 431 of the retention ring 43a needs to be firmly joined to the attachment portion 425 of the rotor core 42 so that the retention ring 43a is not detached from the rotor core 42 by a centrifugal force. Accordingly, in this example, the core-side end 431 of the retention ring 43a is joined to the attachment portion 425 of the rotor core 42 by shrink fit.

The core-side end 431 has an end surface 431a perpendicular to the axial direction, and the plate-side end 432 has an end surface 432a perpendicular to the axial direction. An annular end plate 9 is attached to the end surface 432a of the plate-side end 432. When the retention ring 43a is shrink-fitted to the rotor core 42, the core-side end 431 of the retention ring 43a is contracted, so that the shape of the retention ring 43a might be deformed in its entirety. Considering this, the end plate 9 is attached to the end surface 432a of the plate-side end 432, whereby deformation of the retention ring 43a is suppressed. The end plate 9 is not in contact with the rotary shaft 41, and there is a space between the inner circumferential surface of the end plate 9 and the outer circumferential surface of the rotary shaft 41.

The end plate 9 needs to be firmly fixed to the plate-side end 432 so that the end plate 9 is not detached from the retention ring 43a by a centrifugal force. Accordingly, in this example, the end plate 9 is joined to the plate-side end 432 by shrink fit.

Figure 7:
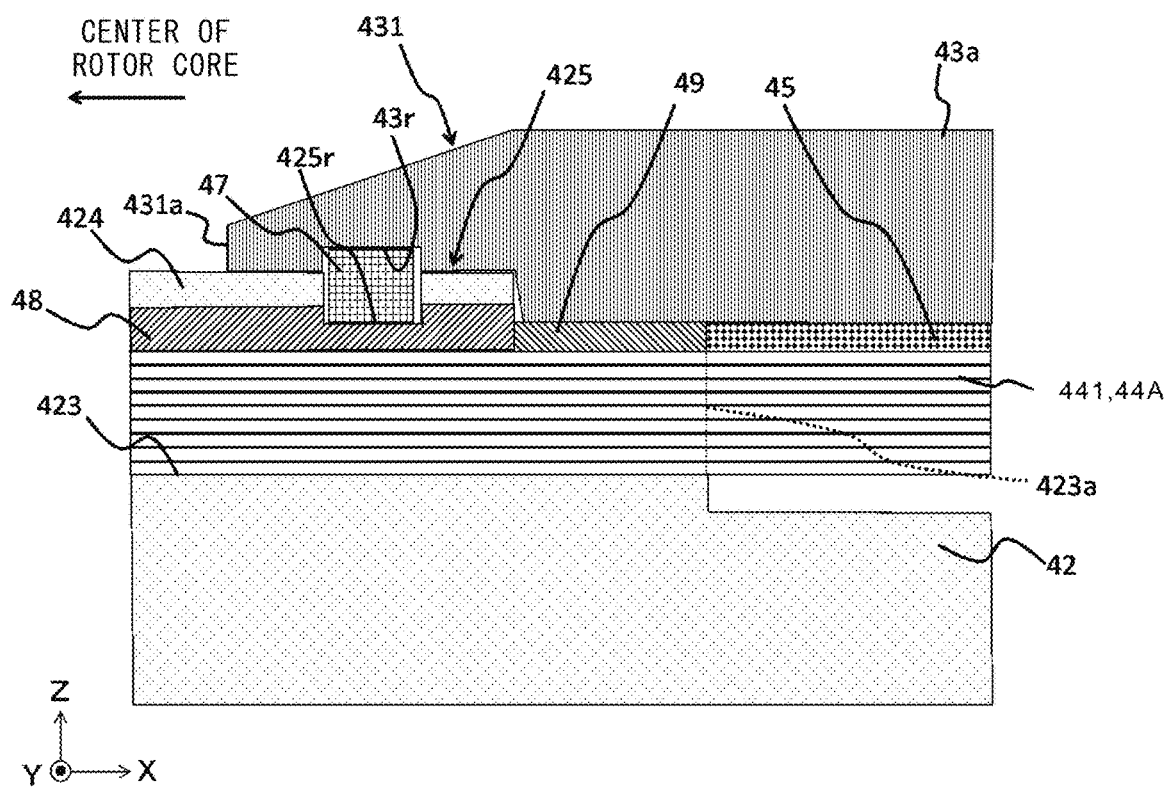
FIG. 7 is a sectional view of the retention ring and the surrounding part thereof in embodiment 1.

FIG. 7 is a sectional view of the retention ring 43a and the surrounding part thereof. The cross-section in FIG. 7 is a cross section parallel to the axial direction (hereinafter, referred to as axis parallel cross-section), and is a cross-section along the line-shaped portion 441 in one slot 423. In FIG. 7, the leftward direction corresponds to a direction toward the center of the rotor core 42 (rightward direction in FIG. 6).

As shown in FIG. 7, the line-shaped portion 441 of the rotor winding 44A is located in the slot 423. In FIG. 7, an end 423a of the slot 423 is indicated by a dotted line. The line-shaped portion 441 extends in the axial direction over the end 423a of the slot 423. As described above, in the slot 423, the wedge 48 is provided so as to overlap the line-shaped portion 441 of the rotor winding 44A. The wedge 48 is latched by the hook-shaped end (FIG. 4) of the coming-off prevention portion 424, whereby the line-shaped portion 441 is prevented from coming off from the inside of the slot 423. A wedge 49 is provided so as to be adjacent to the wedge 48 in the axial direction. The wedge 49 is located between the wedge 48 and the insulating member 45. The insulating member 45 is positioned in the axial direction by the wedge 49.

A recess 425r is formed along the circumferential direction in the wedges 48 and the attachment portion 425 of the rotor core 42. On the inner circumference of the core-side end 431 of the retention ring 43a, a recess 43r is formed along the circumferential direction so as to overlap the recess 425r. A ring key 47 is provided in the recesses 425r, 43r. The ring key 47 has an annular shape about the axis Cl (FIG. 4) of the rotor core 42. The ring key 47 prevents the retention ring 43a from moving in the axial direction relative to the rotor core 42.

As described above, on the basis of test image data of the test target portions set at the retention rings 43a, 43b, the image processing device 220 (FIG. 1) generates strain change information about the test target portions by digital image correlation. In the digital image correlation, change in the strain distribution in the test target portion is obtained on the basis of change in a random pattern included in the test image data. Accordingly, a random pattern is formed on the test target portion. The random pattern is a pattern having no regularity and is formed by a large number of dots arranged randomly, for example. The random pattern is formed so that measurement by digital image correlation can be performed with a sufficient resolution for assumed strain.

Figure 8:
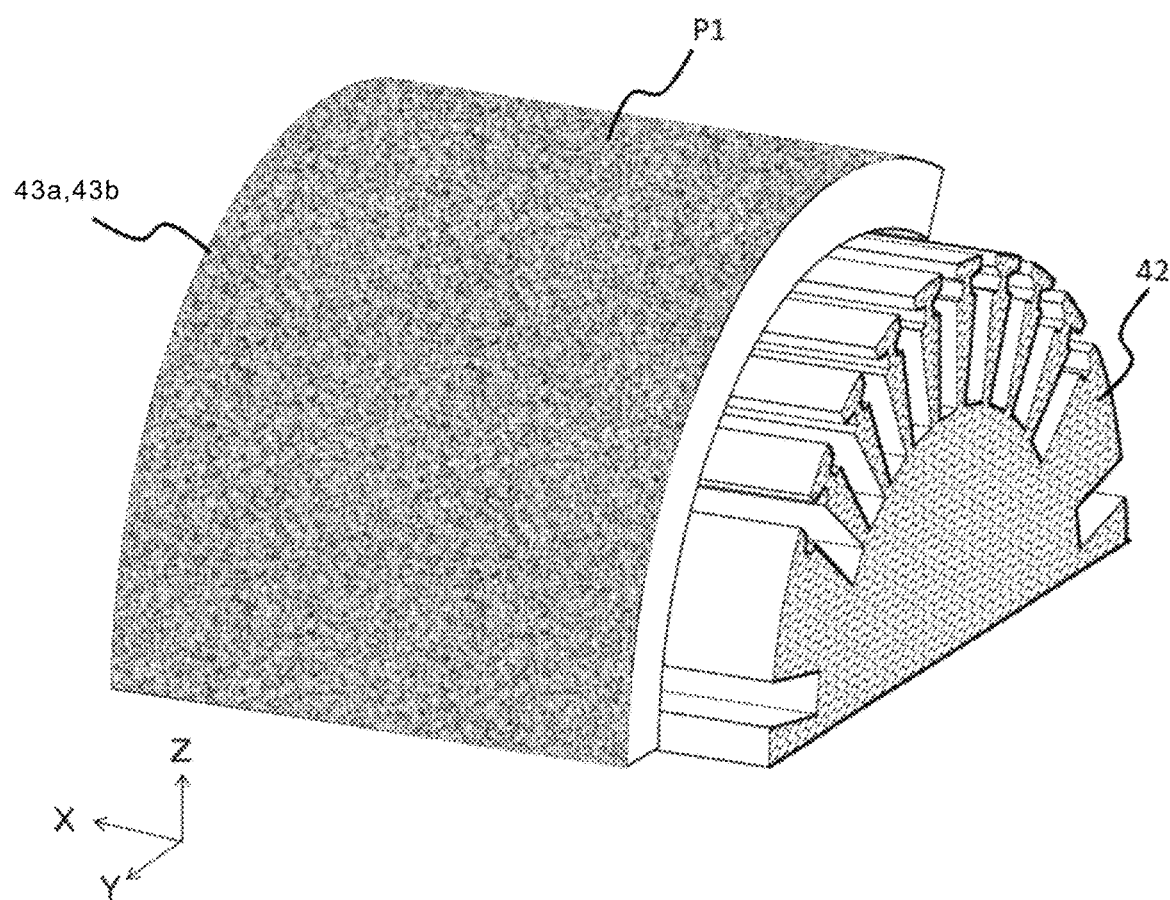
FIG. 8 is a cutaway perspective view illustrating a formation example of a random pattern in embodiment 1.

FIG. 8 is a cutaway perspective view illustrating a formation example of the random pattern. The perspective view in FIG. 8 is different in viewpoint from the perspective view in FIG. 6, and is a view as seen from the center side of the rotor core 42. In FIG. 8, a formation example of the random pattern on the retention ring 43a is shown, but a random pattern is formed in the same manner also on the retention ring 43b.

In the example in FIG. 8, the test target portion is set on the entirety of the outer circumferential surface of the retention ring 43a. In this case, a random pattern P1 is formed on the entirety of the outer circumferential surface in FIG. 8. The random pattern P1 is formed by applying paint on the test target portion, for example. As a specific example, paints of two colors with contrasts greatly different from each other (e.g., white and black) are used. White paint is applied on the entirety of the outer circumferential surface of each retention ring 43a, 43b, and black paint is applied thereon so that a plurality of minute black dots are unevenly arranged. Thus, the random pattern P1 made of two colors of white and black is formed. The size of the black dot is set to several μm to several mm. The smaller the black dot is, the higher the resolution for strain by digital image correlation is. In addition, the smaller the distance between the black dots is, the higher the resolution for strain by digital image correlation is. The size of the black dot and the distance between the black dots are set on the basis of the deformation amount of the test target portion and the magnitude of strain to be measured.

The retention rings 43a, 43b are firmly joined to the rotor core 42 and the end plates 9. Therefore, at these joining parts, stress is likely to concentrate not only during operation of the rotating electric machine 100 but also when the rotating electric machine 100 is stopped. In addition, between each retention ring 43a, 43b and the rotor core 42, the ring key 47 is provided for preventing them from moving in the axial direction relative to each other, and therefore stress is likely to concentrate on also parts of the retention rings 43a, 43b and parts of the rotor core 42 that are in contact with the ring keys 47. Thus, strain distribution is constantly arising in the retention rings 43a, 43b. The strain distribution in each retention ring 43a, 43b changes when damage such as crack occurs in the retention ring 43a, 43b or the surrounding part thereof. Accordingly, in the present embodiment, the states of the retention rings 43a, 43b, the rotor core 42, and the end plates 9 are tested using test image data of the outer circumferential surfaces of the retention rings 43a, 43b which are the test target portions.

Figure 9:
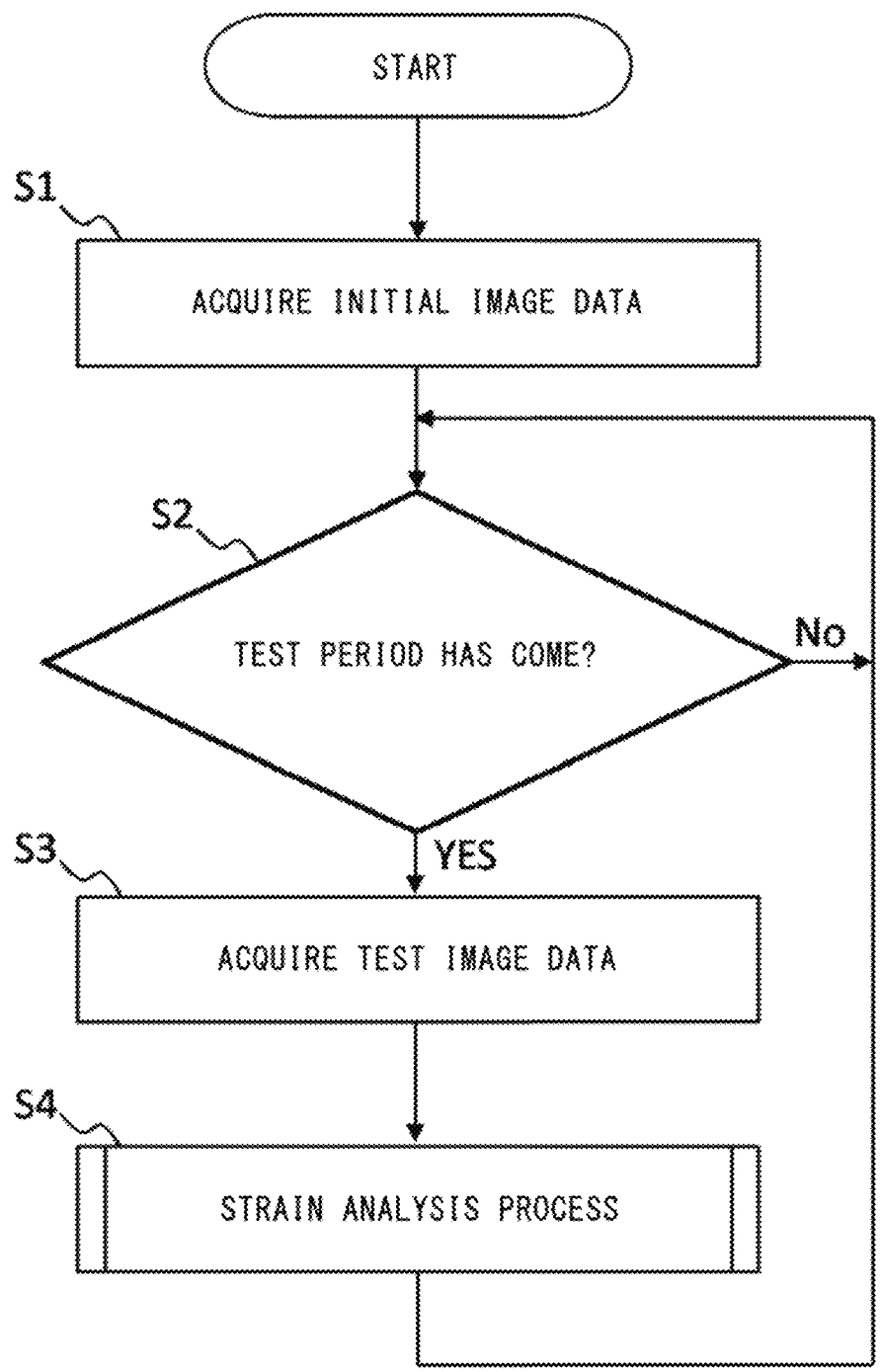
FIG. 9 is a flowchart showing a series of operations of the test device in embodiment 1.
Figure 10:
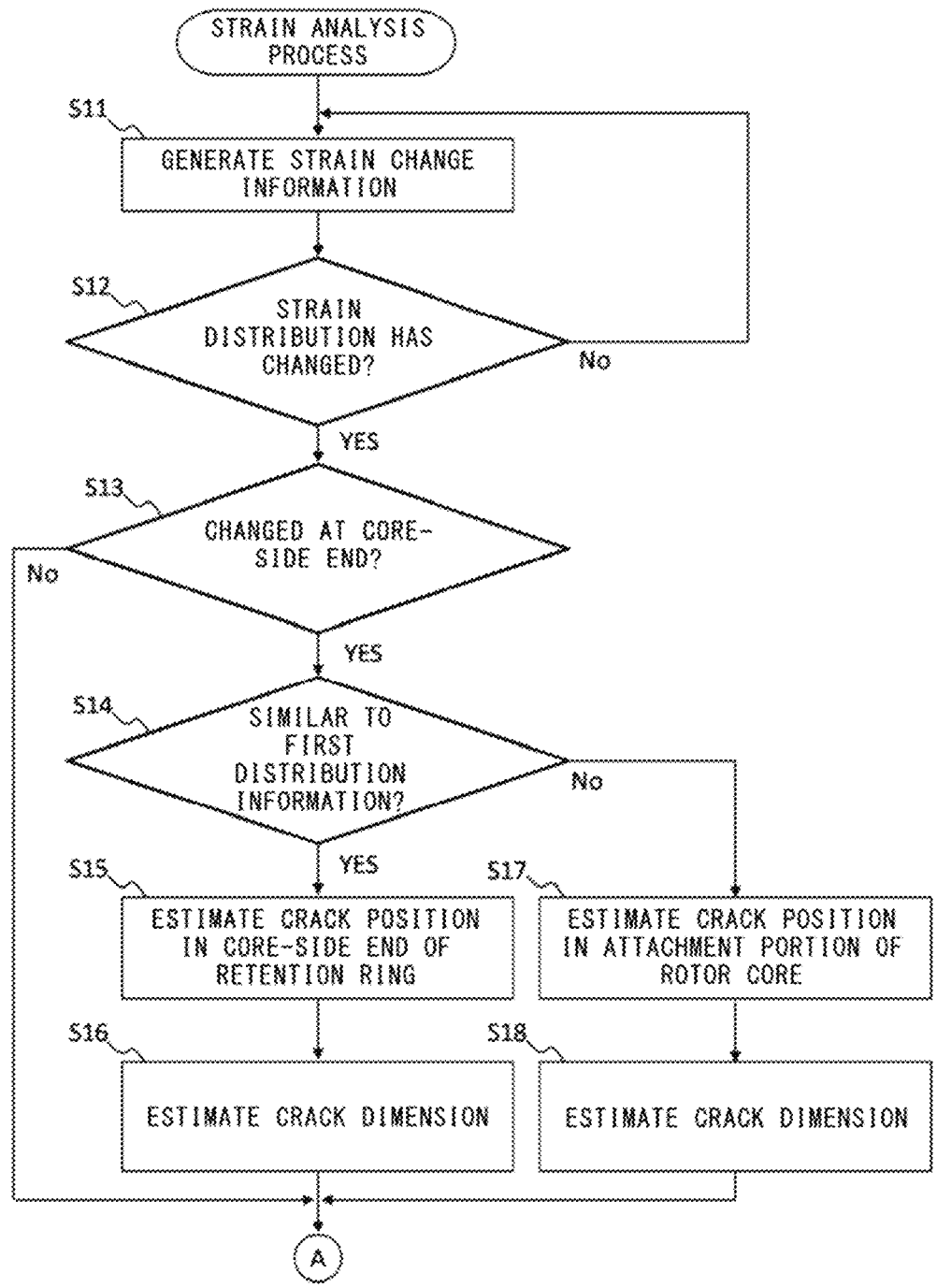
FIG. 10 is a flowchart showing the details of a strain analysis process in embodiment 1.
Figure 11:
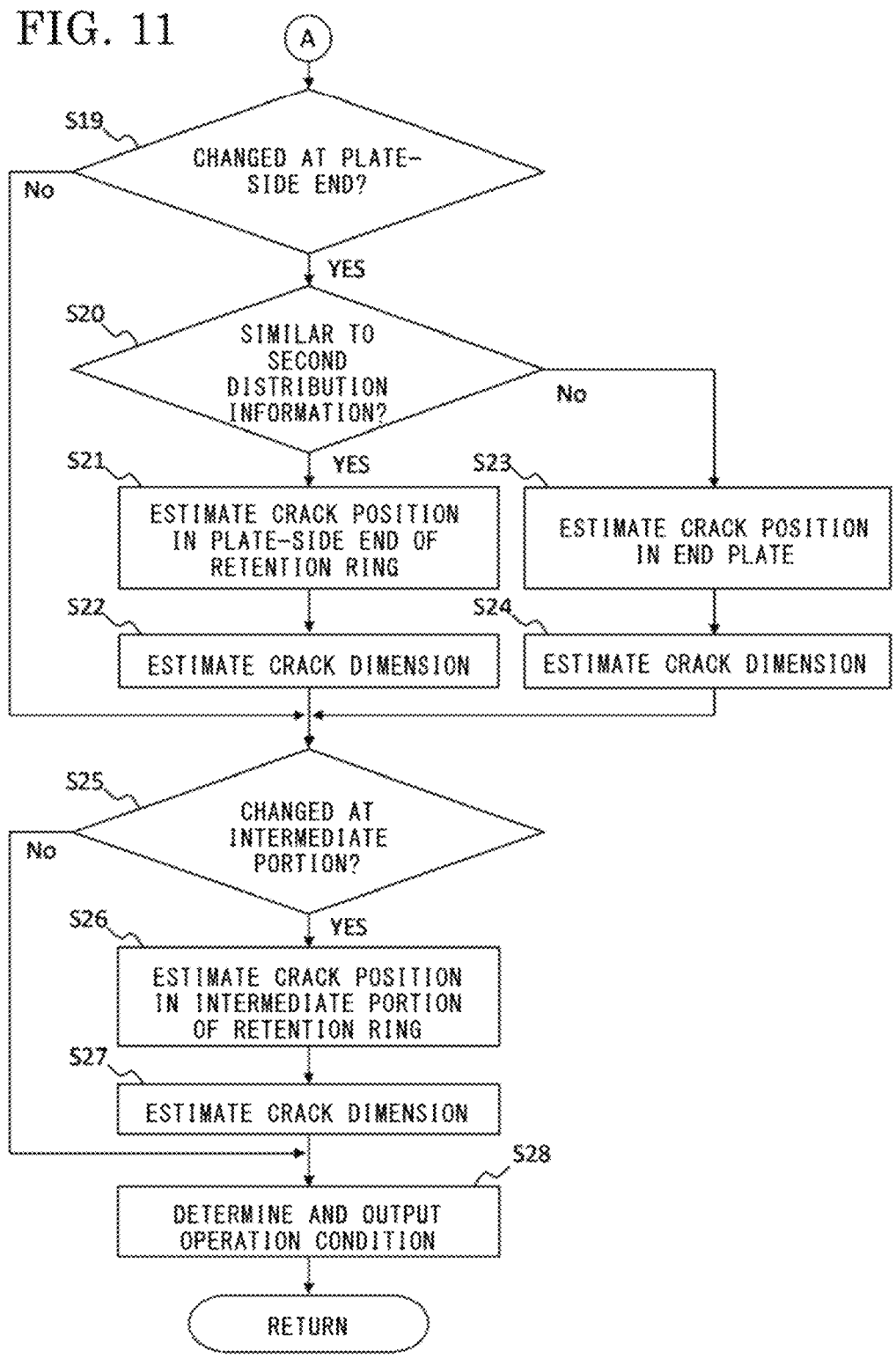
FIG. 11 is a flowchart showing the details of the strain analysis process in embodiment 1.

FIG. 9 to FIG. 11 are flowcharts showing a series of operations of the test device 200. With reference to FIG. 9 to FIG. 11, a test method for the rotating electric machine 100 by the test device 200 will be described.

First, in step S1 in FIG. 9, the imaging control unit 221 of the image processing device 220 controls the imaging devices 210a, 210b and the driving mechanisms 211a, 211b so as to image the test target portions in the initial period. Specifically, in a state in which the rotor 4 is rotated at a low speed by the prime mover, the imaging devices 210a, 210b perform imaging while the imaging devices 210a, 210b are moved in the axial direction by the driving mechanisms 211a, 211b. Thus, initial image data representing the entirety of the outer circumferential surface of each retention ring 43a, 43b is generated. The image data acquisition unit 222 acquires the initial image data transmitted from the imaging devices 210a, 210b. The acquired initial image data is stored in the image data storage unit 223.

In step S2, the imaging control unit 221 determines whether or not the test period has come. When the test period has come, the process proceeds to step S3, in which the imaging control unit 221 controls the imaging devices 210a, 210b and the driving mechanisms 211a, 211b so as to image the retention rings 43a, 43b which are the test target portions. In this case, the imaging control unit 221 controls the imaging devices 210a, 210b and the driving mechanisms 211a, 211b in the same manner as in step S1. Thus, test image data representing the entirety of the outer circumferential surface of each retention ring 43a, 43b is generated, and the image data acquisition unit 222 acquires the test image data transmitted from the imaging devices 210a, 210b. In step S4, the image processing device 220 performs a strain analysis process described later. Thereafter, the test device 200 repeats steps S2 to S4.

FIG. 10 and FIG. 11 show the details of the strain analysis process. In the following description, the retention rings 43a, 43b are referred to as retention rings 43 without being discriminated from each other, as necessary. The process for the retention ring 43b and the process for the retention ring 43a are the same, and therefore, without discrimination therebetween, the process for the retention ring 43 will be described.

In step S11, the strain change information generation unit 225 generates strain change information on the basis of the initial image data stored in the image data storage unit 223 and the test image data acquired by the image data acquisition unit 222. In step S12, the crack position estimation unit 228 determines whether or not the strain distribution in the test target portion has changed from that in the initial period, on the basis of the strain change information generated in step S11. Specifically, if the displacement amount of any part represented by the strain change information is equal to or greater than a prescribed value, the crack position estimation unit 228 determines that the strain distribution in the test target portion has changed. The prescribed value is set to be a displacement amount that arises in the test target portion when crack starts to occur at any of the retention rings 43a, 43b, the attachment portion 425 of the rotor core 42, and the end plates 9. That is, when crack has occurred at any of the retention rings 43a, 43b, the attachment portion 425 of the rotor core, and the end plates 9, the displacement amount represented by the strain change information becomes equal to or greater than the prescribed value. If the strain distribution in the test target portion has changed, the process proceeds to step S13, and otherwise, the process returns to step S11.

In this example, the tendency information stored in the tendency information storage unit 226 includes first to fifth distribution information. The first distribution information represents the strain distribution in the test target portion in the case where crack has occurred at the core-side end 431 of the retention ring 43. The second distribution information represents the strain distribution in the test target portion in the case where crack has occurred at the plate-side end 432 of the retention ring 43. The third distribution information represents the strain distribution in the test target portion in the case where crack has occurred at a part (hereinafter, referred to as intermediate portion) of the retention ring 43 between the core-side end 431 and the plate-side end 432. The fourth distribution information represents the strain distribution in the test target portion in the case where crack has occurred at the attachment portion 425 of the rotor core 42. The fifth distribution information represents the strain distribution in the test target portion in the case where crack has occurred at the end plate 9. It is noted that the first distribution information in the present embodiment corresponds to first distribution information in the claims, and the fourth distribution information in the present embodiment corresponds to second distribution information in the claims.

In step S13, the crack position estimation unit 228 determines whether or not the strain distribution at the core-side end 431 of the retention ring 43 has changed, on the basis of the strain change information generated in step S11. Specifically, whether or not the displacement amount at the core-side end 431 of the retention ring 43 is equal to or greater than the above prescribed value, is determined. If crack has occurred at the core-side end 431 of the retention ring 43 or the attachment portion 425 of the rotor core 42, the displacement amount at the core-side end 431 of the retention ring 43 becomes equal to or greater than the prescribed value, and thus it is determined that the strain distribution at the core-side end 431 of the retention ring 43 has changed.

If the strain distribution at the core-side end 431 has changed, the process proceeds to step S14, and otherwise, the process proceeds to step S19. In step S14, the crack position estimation unit 228 determines whether or not the changed strain distribution represented by the strain change information and the strain distribution represented by the first distribution information are similar to each other. As described above, the first distribution information represents the strain distribution in the test target portion in the case where crack has occurred at the core-side end 431 of the retention ring 43. For example, the crack position estimation unit 228 calculates the matching degree between the changed strain distribution at the core-side end 431 represented by the strain change information and the strain distribution at the core-side end 431 represented by the first distribution information, and if the matching degree is greater than a predetermined threshold, the crack position estimation unit 228 determines that the strain distributions represented by the strain change information and the first distribution information are similar to each other. If the strain distributions represented by the strain change information and the first distribution information are similar to each other, the process proceeds to step S15, and otherwise, the process proceeds to step S17.

If the strain distributions represented by the strain change information and the first distribution information are similar to each other, the crack position estimation unit 228 estimates that crack has occurred at the core-side end 431 of the retention ring 43. In this case, in step S15, the crack position estimation unit 228 estimates the crack position in the core-side end 431 of the retention ring 43 through inverse analysis of digital image correlation on the basis of the strain change information and the first distribution information. Further, in step S16, the crack dimension estimation unit 229 estimates the crack dimension in the core-side end 431 of the retention ring 43 through inverse analysis of digital image correlation on the basis of the strain change information and the first distribution information, and then the process proceeds to step S19.

In step S14, if the strain distributions represented by the strain change information and the first distribution information are not similar to each other, the crack position estimation unit 228 estimates that crack has occurred at the attachment portion 425 of the rotor core 42 instead of the core-side end 431 of the retention ring 43. In this case, in step S17, the crack position estimation unit 228 estimates the crack position in the attachment portion 425 of the rotor core 42 through inverse analysis of digital image correlation on the basis of the strain change information and the fourth distribution information. As described above, the fourth distribution information represents the strain distribution in the test target portion in the case where crack has occurred at the attachment portion 425 of the rotor core 42. Further, in step S18, the crack dimension estimation unit 229 estimates the crack dimension in the attachment portion 425 of the rotor core 42 through inverse analysis of digital image correlation on the basis of the strain change information and the fourth distribution information, and then the process proceeds to step S19.

In step S19, the crack position estimation unit 228 determines whether or not the strain distribution at the plate-side end 432 of the retention ring 43 has changed, on the basis of the strain change information. Specifically, whether or not the displacement amount at the plate-side end 432 of the retention ring 43 is equal to or greater than the above prescribed value, is determined. If crack has occurred at the plate-side end 432 of the retention ring 43 or the end plate 9, the displacement amount at the plate-side end 432 of the retention ring 43 becomes equal to or greater than the prescribed value, and thus it is determined that the strain distribution at the plate-side end 432 of the retention ring 43 has changed.

If the strain distribution at the plate-side end 432 of the retention ring 43 has changed, the process proceeds to step S20, and otherwise, the process proceeds to step S25. In step S20, the crack position estimation unit 228 determines whether or not the changed strain distribution represented by the strain change information and the strain distribution represented by the second distribution information are similar to each other. As described above, the second distribution information represents the strain distribution in the test target portion in the case where crack has occurred at the plate-side end 432 of the retention ring 43. In this case, the crack position estimation unit 228 determines whether or not they are similar to each other, in the same manner as in step S14. If the strain distributions represented by the strain change information and the second distribution information are similar to each other, the process proceeds to step S21, and otherwise, the process proceeds to step S23.

In the case where the strain distributions represented by the strain change information and the second distribution information are similar to each other, the crack position estimation unit 228 estimates that crack has occurred at the plate-side end 432 of the retention ring 43. In this case, in step S21, the crack position estimation unit 228 estimates the crack position in the plate-side end 432 of the retention ring 43 through inverse analysis of digital image correlation on the basis of the strain change information and the second distribution information. Further, in step S22, the crack dimension estimation unit 229 estimates the crack dimension in the plate-side end 432 of the retention ring 43 through inverse analysis of digital image correlation on the basis of the strain change information and the second distribution information, and then the process proceeds to step S25.

In step S20, if the strain distributions represented by the strain change information and the second distribution information are not similar to each other, the crack position estimation unit 228 estimates that crack has occurred at the end plate 9 instead of the plate-side end 432 of the retention ring 43. In this case, in step S23, the crack position estimation unit 228 estimates the crack position in the end plate 9 through inverse analysis of digital image correlation on the basis of the strain change information and the fifth distribution information. As described above, the fifth distribution information represents the strain distribution in the test target portion in the case where crack has occurred at the end plate 9. Further, in step S24, the crack dimension estimation unit 229 estimates the crack dimension in the end plate 9 through inverse analysis of digital image correlation on the basis of the strain change information and the fifth distribution information, and then the process proceeds to step S25.

In step S25, the crack position estimation unit 228 determines whether or not the strain distribution at the intermediate portion of the retention ring 43 has changed, on the basis of the strain change information. Specifically, whether or not the displacement amount at the intermediate portion of the retention ring 43 is equal to or greater than the prescribed value, is determined. If crack has occurred at the intermediate portion of the retention ring 43, the displacement amount at the intermediate portion of the retention ring 43 becomes equal to or greater than the prescribed value, and thus it is determined that the strain distribution at the intermediate portion of the retention ring 43 has changed.

If the strain distribution at the intermediate portion of the retention ring 43 has changed, the process proceeds to step S26, and otherwise, the process proceeds to step S28. If the strain distribution at the intermediate portion of the retention ring 43 has changed, the crack position estimation unit 228 estimates that crack has occurred at the intermediate portion of the retention ring 43. In this case, in step S26, the crack position estimation unit 228 estimates the crack position in the intermediate portion of the retention ring 43 through inverse analysis of digital image correlation on the basis of the strain change information and the third distribution information. As described above, the third distribution information represents the strain distribution in the test target portion in the case where crack has occurred at the intermediate portion of the retention ring 43. In addition, in step S27, the crack dimension estimation unit 229 estimates the crack dimension in the intermediate portion of the retention ring 43 through inverse analysis of digital image correlation on the basis of the strain change information and the third distribution information, and then the process proceeds to step S28.

In step S28, the operation condition determination unit 231 determines an appropriate operation condition (operation possible time and appropriate speed) by a known method based on material property and fracture mechanics, on the basis of the estimated crack position and crack dimension, and outputs the determined operation condition to the display device 240. Thus, the display device 240 displays the operation condition given from the operation condition determination unit 231. The worker adjusts the rotation speed of the rotor 4 to the appropriate speed on the basis of the display on the display device 240, whereby the life of the rotating electric machine 100 can be prolonged. In addition, the worker can perform repair or part replacement at an appropriate timing on the basis of the displayed operation possible time.

The estimation for the crack position in steps S15, S17, S21, S23, S26 may be performed by another method, instead of the method using the inverse analysis as described above. For example, a table representing a plurality of change patterns of the strain distribution and crack positions corresponding to the respective change patterns, is prepared in advance. The crack position estimation unit 228 may determine which of the plurality of change patterns included in the table the change in the strain distribution represented by the strain change information corresponds to, and acquire the crack position corresponding to the change pattern from the table.

The estimation for the crack dimension in steps S16, S18, S22, S24, S27 may be performed by another method, instead of the method using the inverse analysis as described above. For example, a table representing a plurality of change patterns of the strain distribution and the crack dimensions corresponding to the respective change patterns, is prepared in advance. The crack dimension estimation unit 229 may determine which of the plurality of change patterns included in the table the change in the strain distribution represented by the strain change information corresponds to, and acquire the crack dimension corresponding to the change pattern from the table.

The determination for the operation condition in step S28 may be performed by another method, instead of the method based on material property and fracture mechanics. For example, a map representing the relationship among the crack position, the crack dimension, the operation possible time, and the appropriate speed is prepared in advance. The operation condition determination unit 231 may acquire the operation possible time and the appropriate speed corresponding to the estimated crack position and crack dimension, from the map.

Alternatively, learned data representing the relationship of a plurality of parameters may be generated through machine learning using a neural network or the like, and using the learned data, the crack position, the crack dimension, and the operation condition may be estimated or determined.

As described above, in the test method for the rotating electric machine 100 according to embodiment 1, the random pattern P1 on the outer circumferential surface of each retention ring 43*a*, 43*b* is imaged as the test target portion, and on the basis of the generated test image data, strain change information representing change in the strain distribution in each retention ring 43*a*, 43*b* is generated by digital image correlation. In this case, on the basis of the generated strain change information, presence/absence of damage in the retention rings 43*a*, 43*b* and the surrounding parts thereof, and the degree of such damage, can be estimated. Thus, it is possible to efficiently test the state of the rotor 4 in a short time without disassembling the rotating electric machine 100.

In embodiment 1, initial image data is generated by imaging the test target portion in the initial period, and test image data is generated by imaging the test target portion in the test period thereafter. The strain change information is generated on the basis of the initial image data and the test image data, whereby change in the strain distribution in the test target portion can be accurately obtained. Thus, the state of the rotor 4 can be accurately tested.

In embodiment 1, the crack position and the crack dimension are estimated on the basis of the generated strain change information and the tendency information representing the tendency of change in the strain distribution in the retention rings 43*a*, 43*b*. Thus, an appropriate operation condition for the rotating electric machine 100 can be determined from the crack position and the crack dimension, whereby the life of the rotating electric machine 100 can be prolonged and repair or part replacement can be performed at an appropriate timing.

In embodiment 1, the crack position and the crack dimension in the retention rings 43*a*, 43*b*, the rotor core 42, and the end plates 9 are estimated on the basis of the first to third distribution information representing the strain distributions in the case where crack has occurred at the retention rings 43*a*, 43*b*, the fourth distribution information representing the strain distribution in the case where crack has occurred at the attachment portion 425 of the rotor core 42, and the fifth distribution information representing the strain distribution in the case where crack has occurred at the end plate 9. Thus, it is possible to test the states of not only the retention rings 43*a*, 43*b* which are test target portions but also the rotor core 42 and the end plates 9 present therearound.

Embodiment 2

Figure 12:
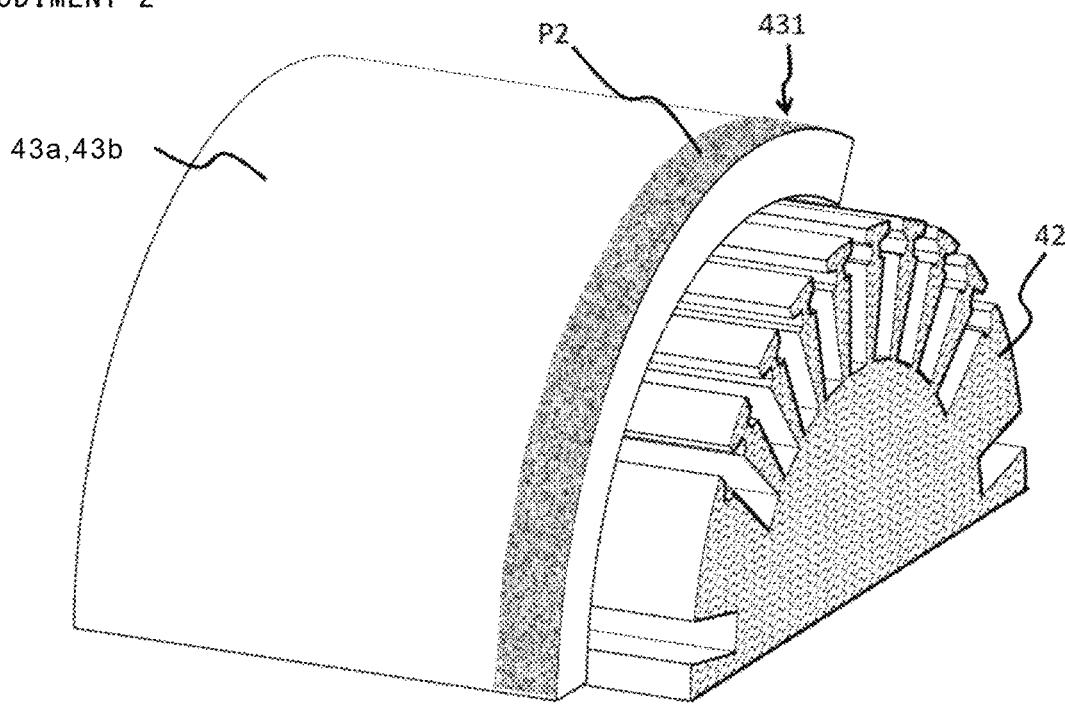
FIG. 12 is an external perspective view illustrating a test target portion in embodiment 2.

A rotating electric machine test method, a rotating electric machine test device, and a rotating electric machine according to embodiment 2 of the present invention will be described, focusing on a difference from the above embodiment 1. Embodiment 2 is different in test target portions from the above embodiment 1. FIG. 12 is an external perspective view illustrating a test target portion in embodiment 2. In embodiment 2, as shown in FIG. 12, a random pattern P2 is formed on the outer circumferential surface of the core-side end 431 of each retention ring 43a, 43b. That is, the test target portions are set at the outer circumferential surfaces of the core-side ends 431 of the retention rings 43a, 43b.

In testing, in a state in which the rotor 4 is rotated at a low speed by the prime mover, the imaging devices 210a, 210b image the random patterns P2 on the outer circumferential surfaces of the core-side ends 431 while the imaging devices 210a, 210b are moved in the axial direction by the driving mechanisms 211a, 211b. Thus, test image data of the test target portions are generated. On the basis of the generated test image data, strain change information representing change in the strain distribution in the outer circumferential surface of the core-side end 431 is generated by digital image correlation. Thereafter, through the same process as in the above embodiment 1, the crack position and the crack dimension are estimated on the basis of the strain change information, and the operation condition is determined and outputted. Specifically, through the process from step S13 to step S18 in FIG. 10, the crack position and the crack dimension in the core-side end 431 and the attachment portion 425 of the rotor core 42 are estimated. In addition, through the process in step S28 in FIG. 11, the operation condition is determined and outputted.

As described above, in embodiment 2, the random pattern P2 on the outer circumferential surface of the core-side end 431 of each retention ring 43a, 43b is imaged as the test target portion, and on the basis of the generated test image data, strain change information representing change in the strain distribution in the outer circumferential surface of the core-side end 431 is generated by digital image correlation. As described above, each retention ring 43a, 43b and the rotor core 42 are fixed to each other by only joining between the core-side end 431 and the attachment portion 425. Therefore, the strain distribution at the core-side end 431 is likely to change. Accordingly, by limiting the test target portions to the core-side ends 431, the states of the retention rings 43a, 43b can be efficiently tested.

On the basis of change in the strain distribution at the core-side end 431, the crack position and the crack dimension in the attachment portion 425 of the rotor core 42 can be estimated (see steps S17, S18 in FIG. 10). Thus, the states of not only the retention rings 43a, 43b but also the rotor core 42 can be efficiently tested.

The ranges of imaging by the imaging devices 210a, 210b are limited to the outer circumferential surfaces of the core-side ends 431 of the retention rings 43a, 43b. Therefore, the times of imaging by the imaging devices 210a, 210b can be shortened. In addition, the movement ranges of the imaging devices 210a, 210b are limited, so that the configuration of the driving mechanisms 211a, 211b can be simplified.

In the case where, in the axial direction, the random pattern P2 on the outer circumferential surface of the core-side end 431 is within the field of view of imaging by each imaging device 210a, 210b, it is possible to image the test target portions without moving the imaging devices 210a, 210b in the axial direction. Thus, the driving mechanisms 211a, 211b are not needed.

Embodiment 3

Figure 13:
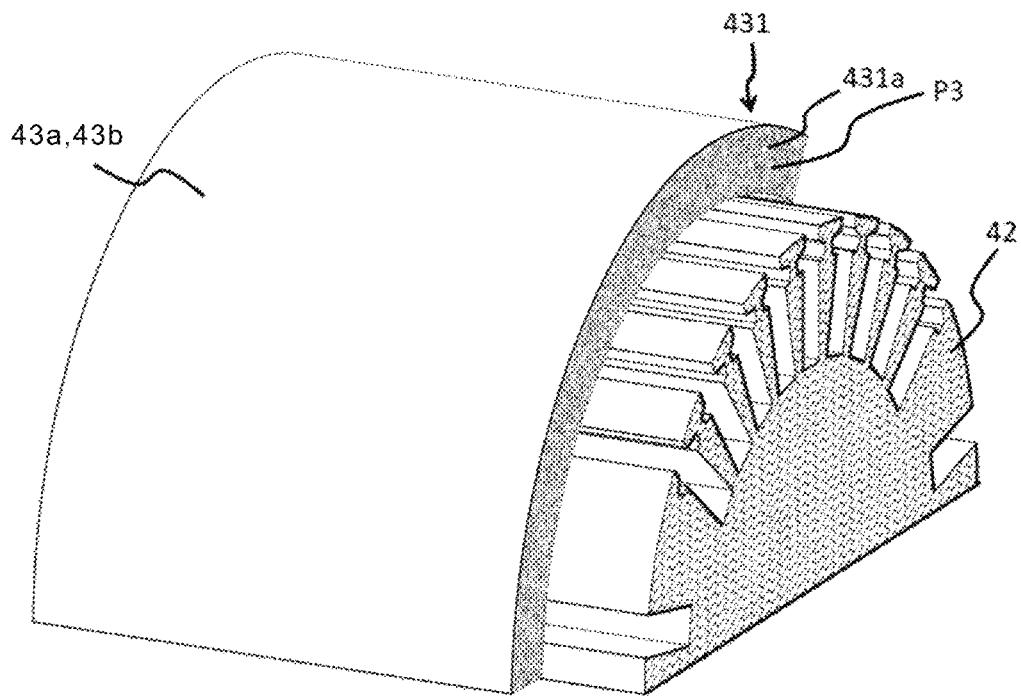
FIG. 13 is an external perspective view illustrating a test target portion in embodiment 3.

A rotating electric machine test method, a rotating electric machine test device, and a rotating electric machine according to embodiment 3 of the present invention will be described, focusing on a difference from the above embodiment 1. Embodiment 3 is different in test target portions from the above embodiment 1. FIG. 13 is an external perspective view illustrating a test target portion in embodiment 3. In embodiment 3, as shown in FIG. 13, a random pattern P3 is formed on the end surface 431a of the core-side end 431 of each retention ring 43a, 43b. That is, in embodiment 3, the test target portions are set at the end surfaces 431a of the retention rings 43a, 43b. In this case, the imaging devices 210a, 210b may be provided so as to be opposed to the end surfaces 431a of the retention rings 43a, 43b.

In testing, in a state in which the rotor 4 is rotated at a low speed by the prime mover, the imaging devices 210a, 210b image the random patterns P3 on the end surfaces 431a while the imaging devices 210a, 210b are moved in the radial direction by the driving mechanisms 211a, 211b. Thus, test image data of the test target portions are generated. On the basis of the generated test image data, strain change information representing change in the strain distribution in the end surface 431a of the core-side end 431 is generated by digital image correlation. Thereafter, through the same process as in the above embodiment 1, the crack position and the crack dimension are estimated on the basis of the strain change information, and the operation condition is determined and outputted.

As described above, in embodiment 3, the random pattern P3 on the end surface 431a of each retention ring 43a, 43b is imaged as the test target portion, and on the basis of the generated test image data, strain change information representing change in the strain distribution in the end surface 431a is generated by digital image correlation. As described above, the strain distribution is likely to change at the core-side end 431. In particular, the end surface 431a is closer to the attachment portion 425 of the rotor core 42 than the outer circumferential surface of each retention ring 43a, 43b, and therefore stress from the attachment portion 425 is more likely to concentrate on the end surface 431a, so that the strain distribution is likely to change. Accordingly, by limiting the test target portions to the end surfaces 431a, the states of the retention rings 43a, 43b can be efficiently tested.

As described above, on the basis of change in the strain distribution at the core-side end 431, the crack position and the crack dimension in the attachment portion 425 of the rotor core 42 can be estimated. Thus, the states of not only the retention rings 43a, 43b but also the surrounding parts thereof can be efficiently tested.

It is easy to visually recognize the end surfaces 431a of the retention rings 43a, 43b. Therefore, when it has been found from the strain change information that strain has occurred in the end surface 431a of any of the retention rings 43a, 43b, the worker can visually confirm the end surface 431a of the retention ring 43a, 43b without disassembling the rotating electric machine 100.

The ranges of imaging by the imaging devices 210a, 210b are limited to the end surfaces 431a of the retention rings 43a, 43b. Therefore, the times of imaging by the imaging devices 210a, 210b can be shortened. In addition, the configuration of the driving mechanisms 211a, 211b can be simplified.

In the case where, in the radial direction, the random pattern P3 on the end surface 431a is within the field of view of imaging by each imaging device 210a, 210b, it is possible to image the test target portions without moving the imaging devices 210a, 210b in the radial direction. Thus, the driving mechanisms 211a, 211b are not needed.

Embodiment 4

Figure 14:
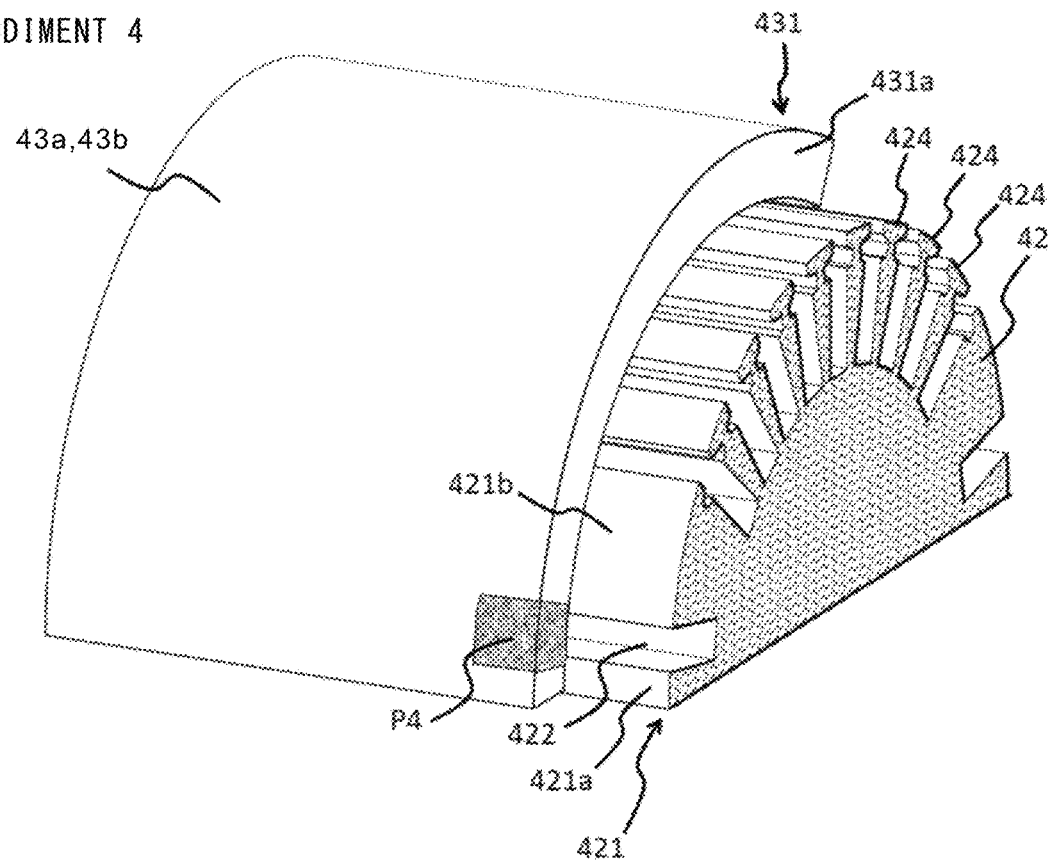
FIG. 14 is an external perspective view illustrating a test target portion in embodiment 4.

A rotating electric machine test method, a rotating electric machine test device, and a rotating electric machine according to embodiment 4 of the present invention will be described, focusing on a difference from the above embodiment 1. Embodiment 4 is different in test target portions from the above embodiment 1. FIG. 14 is an external perspective view illustrating a test target portion in embodiment 4. In embodiment 4, as shown in FIG. 14, a random pattern P4 is formed on a part (hereinafter, referred to as air passage outward end) of the core-side end 431 that is located radially outward of the air passage 422 of the rotor core 42. That is, the test target portions are set at the air passage outward ends of the retention rings 43a, 43b. Each air passage outward end includes a part of the outer circumferential surface of the core-side end 431 and a part of the end surface 431a, and overlaps the air passage 422 in the radial direction.

In testing, in a state in which the rotor 4 is rotated at a low speed by the prime mover, the imaging devices 210a, 210b image the random patterns P4 on the air passage outward ends while the imaging devices 210a, 210b are moved by the driving mechanisms 211a, 211b between positions opposed to the outer circumferential surfaces of the core-side ends 431 and positions opposed to the end surfaces 431a. Thus, test image data of the test target portions are generated. On the basis of the generated test image data, strain change information representing change in the strain distribution at the air passage outward end of the core-side end 431 is generated by digital image correlation. Thereafter, through the same process as in the above embodiment 1, the crack position and the crack dimension are estimated on the basis of the strain change information, and the operation condition is determined and outputted.

Since the rotor core 42 has four air passages 422, the retention rings 43a, 43b each include four air passage outward ends. In FIG. 14, only the random pattern P4 formed on one air passage outward end is shown. However, the random patterns P4 may be formed on all the four air passage outward ends.

As described above, in the rotor core 42, the widths in the circumferential direction of the magnetic pole center portion 421a and the magnetic pole end portions 421b of the magnetic pole portion 421 are greater than those of the coming-off prevention portions 424. Therefore, the magnetic pole center portion 421a and the magnetic pole end portions 421b of the magnetic pole portion 421 are greater in stiffness than the coming-off prevention portions 424. Thus, surface pressures applied to, of the core-side end 431 of each retention ring 43a, 43b, a part contacting with the magnetic pole center portion 421a and a part contacting with the magnetic pole end portion 421b, are greater than surface pressures applied to the other parts.

Each air passage 422 is provided between the magnetic pole center portion 421a and the magnetic pole end portion 421b of the magnetic pole portion 421. That is, the air passage outward end is located between the part contacting with the magnetic pole center portion 421a and the part contacting with the magnetic pole end portion 421b. Therefore, at the air passage outward end, the surface pressure difference becomes great, so that the strain distribution is likely to change.

In embodiment 4, the random pattern P4 at the air passage outward end of each retention ring 43a, 43b is imaged as the test target portion, and on the basis of the generated test image data, strain change information representing change in the strain distribution at the air passage outward end is generated by digital image correlation. As described above, the strain distribution at the air passage outward end is likely to change, and therefore, by limiting the test target portions to the air passage outward ends, the states of the retention rings 43a, 43b can be efficiently tested.

In addition, since the number of the air passages 422 of the rotor core 42 is only four, the ranges of imaging by the imaging devices 210a, 210b are limited to the four air passage outward ends of each retention ring 43a, 43b. Therefore, the times of imaging by the imaging devices 210a, 210b can be shortened. In addition, the configuration of the driving mechanisms 211a, 211b can be simplified.

In the example in FIG. 14, the air passage outward end includes a part of the outer circumferential surface of the core-side end 431 and a part of the end surface 431a. However, the air passage outward end may include only a part of the outer circumferential surface of the core-side end 431 or only a part of the end surface 431a. In this case, it becomes possible to further shorten the imaging times and further simplify the driving mechanisms 211a, 211b, or the driving mechanisms 211a, 211b are not needed.

Embodiment 5

Figure 15:
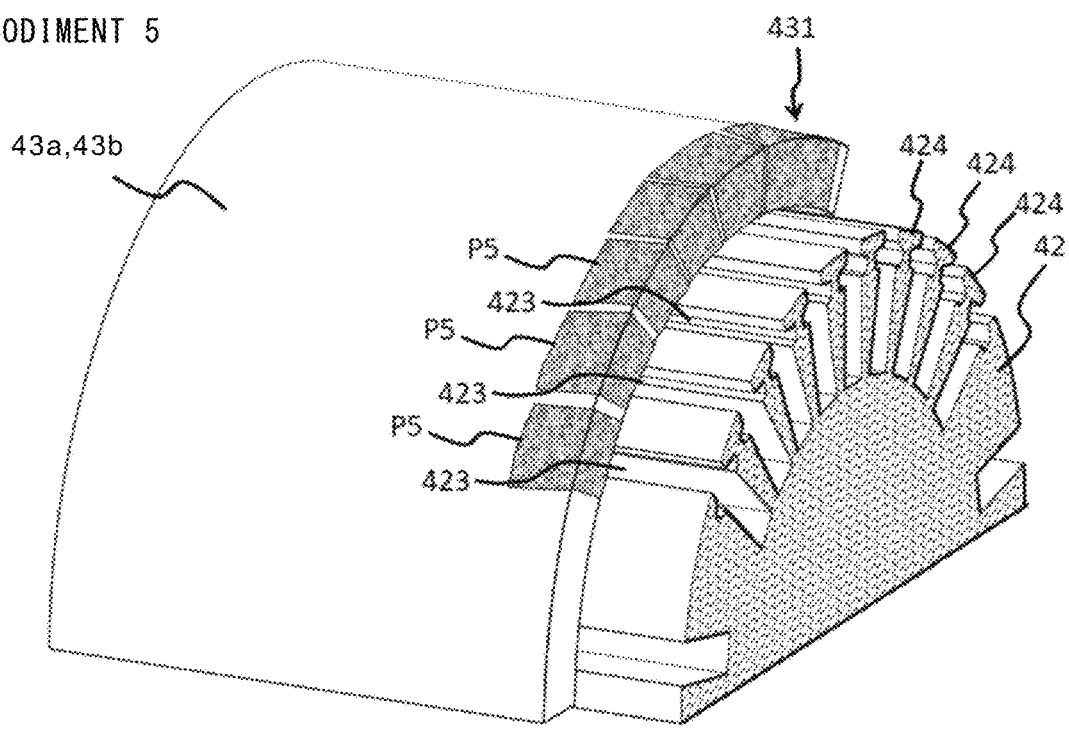
FIG. 15 is an external perspective view illustrating test target portions in embodiment 5.

A rotating electric machine test method, a rotating electric machine test device, and a rotating electric machine according to embodiment 5 of the present invention will be described, focusing on a difference from the above embodiment 1. Embodiment 5 is different in test target portions from the above embodiment 1. FIG. 15 is an external perspective view illustrating test target portions in embodiment 5. In embodiment 5, as shown in FIG. 15, random patterns P5 are formed on a plurality of parts (hereinafter, referred to as slot outward ends) of the core-side end 431 that are located radially outward of the plurality of slots 423 of the rotor core 42. That is, the test target portions are set at the plurality of slot outward ends of the retention rings 43a, 43b. Each slot outward end includes a part of the outer circumferential surface of the core-side end 431 and a part of the end surface 431a, and overlaps each slot 423 in the radial direction. The plurality of slot outward ends are arranged intermittently in the circumferential direction so as to correspond to the plurality of slots 423.

In testing, in a state in which the rotor 4 is rotated at a low speed by the prime mover, the imaging devices 210a, 210b image the random patterns P5 on the slot outward ends while the imaging devices 210a, 210b are moved by the driving mechanisms 211a, 211b between positions opposed to the outer circumferential surfaces of the core-side ends 431 and positions opposed to the end surfaces 431a.

In embodiment 5, the random patterns P5 on each slot outward end of the retention rings 43a, 43b are imaged as the test target portions, and on the basis of the generated test image data, strain change information representing change in the strain distribution at each slot outward end is generated by digital image correlation. Each slot outward end is located between parts of the retention ring 43a, 43b that are in contact with the coming-off prevention portions 424 adjacent to each other. Therefore, also at each slot outward end, the surface pressure difference is great and the strain distribution is likely to change, although the degrees thereof are low as compared to the air passage outward ends described above. Accordingly, by limiting the test target portions to the slot outward ends, the states of the retention rings 43a, 43b can be efficiently tested.

The ranges of imaging by the imaging devices 210a, 210b are limited to the slot outward ends of the retention rings 43a, 43b. Therefore, the times of imaging by the imaging devices 210a, 210b can be shortened. In addition, the configuration of the driving mechanisms 211a, 211b can be simplified.

In the example in FIG. 15, each slot outward end includes a part of the outer circumferential surface of the core-side end 431 and a part of the end surface 431a. However, each slot outward end may include only a part of the outer circumferential surface of the core-side end 431 or only a part of the end surface 431a. In this case, it becomes possible to further shorten the imaging times and further simplify the driving mechanisms 211a, 211b, or the driving mechanisms 211a, 211b are not needed.

Embodiment 6

Figure 16:
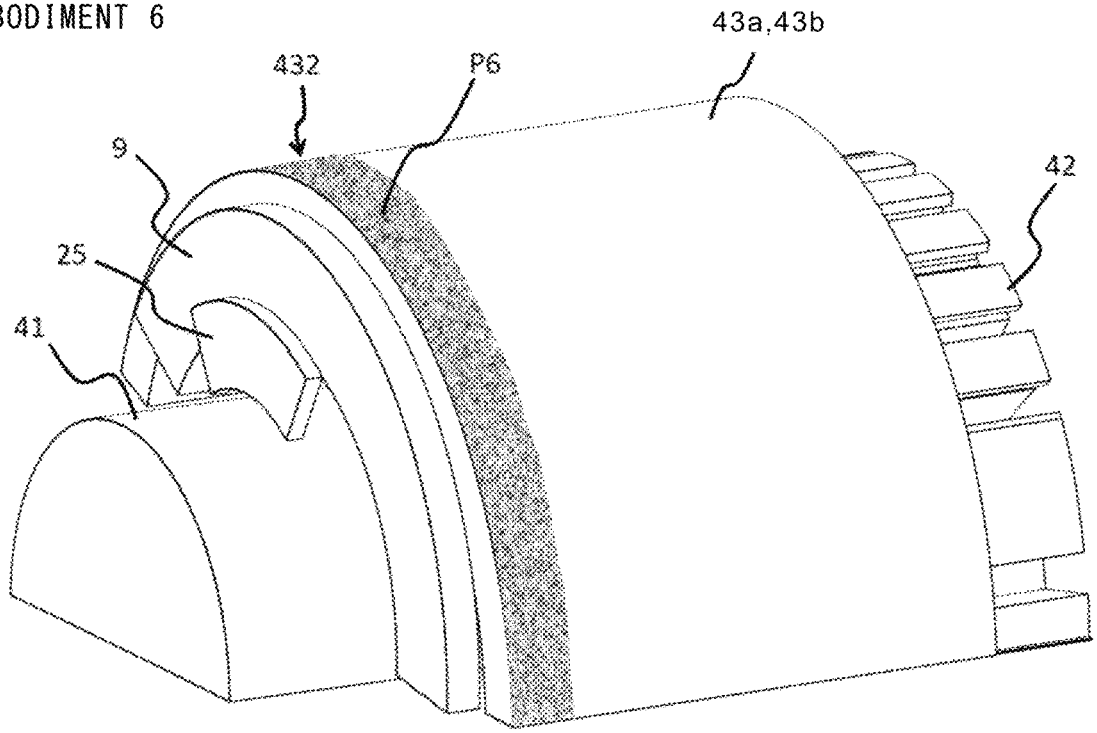
FIG. 16 is an external perspective view illustrating a test target portion in embodiment 6.

A rotating electric machine test method, a rotating electric machine test device, and a rotating electric machine according to embodiment 6 of the present invention will be described, focusing on a difference from the above embodiment 1. Embodiment 6 is different in test target portions from the above embodiment 1. FIG. 16 is an external perspective view illustrating a test target portion in embodiment 6. In embodiment 6, as shown in FIG. 16, a random pattern P6 is formed on the outer circumferential surface of the plate-side end 432. That is, the test target portions are set at the outer circumferential surfaces of the plate-side ends 432 of the retention rings 43a, 43b.

In testing, in a state in which the rotor 4 is rotated at a low speed by the prime mover, the imaging devices 210a, 210b image the random patterns P6 on the outer circumferential surfaces of the plate-side ends 432 while the imaging devices 210a, 210b are moved in the axial direction by the driving mechanisms 211a, 211b.

In the example in FIG. 16, a closing plate 25 for adjusting the amount of cooling gas to be introduced into the air passages 422 of the rotor core 42 is attached to the end plate 9. As described above, in this example, the end plates 9 are firmly fixed to the retention rings 43a, 43b by shrink fit so that the end plates 9 are not detached from the retention rings 43a, 43b. However, due to such firm joining, stress is likely to concentrate on the plate-side ends 432 of the retention rings 43a, 43b so that the strain distribution is likely to change.

In embodiment 6, the random pattern P6 on the outer circumferential surface of the plate-side end 432 of each retention ring 43a, 43b is imaged as the test target portion, and on the basis of the generated test image data, strain change information representing change in the strain distribution at the plate-side end 432 is generated by digital image correlation. As described above, the strain distribution at the plate-side end 432 is likely to change, and therefore, by limiting the test target portions to the outer circumferential surfaces of the plate-side ends 432, the states of the retention rings 43a, 43b can be efficiently tested.

As described above, on the basis of change in the strain distribution at the plate-side end 432, the crack position and the crack dimension in the end plate 9 can be estimated (see steps S23, S24 in FIG. 11). Thus, the states of not only the retention rings 43a, 43b but also the end plates 9 can be efficiently tested.

The ranges of imaging by the imaging devices 210a, 210b are limited to the plate-side ends 432 of the retention rings 43a, 43b. Therefore, the times of imaging by the imaging devices 210a, 210b can be shortened. In addition, the configuration of the driving mechanisms 211a, 211b can be simplified.

In the case where, in the axial direction, the random pattern P6 on the end surface 431a is within the field of view of imaging by each imaging device 210a, 210b, it is possible to image the test target portions without moving the imaging devices 210a, 210b in the axial direction. Thus, the driving mechanisms 211a, 211b are not needed.

In the example in FIG. 16, the test target portion is set only at the outer circumferential surface of the plate-side end 432. However, the test target portion may be set only at the end surface 432a, or may be set at both the outer circumferential surface and the end surface 432a of the plate-side end 432.

Embodiment 7

Figure 17:
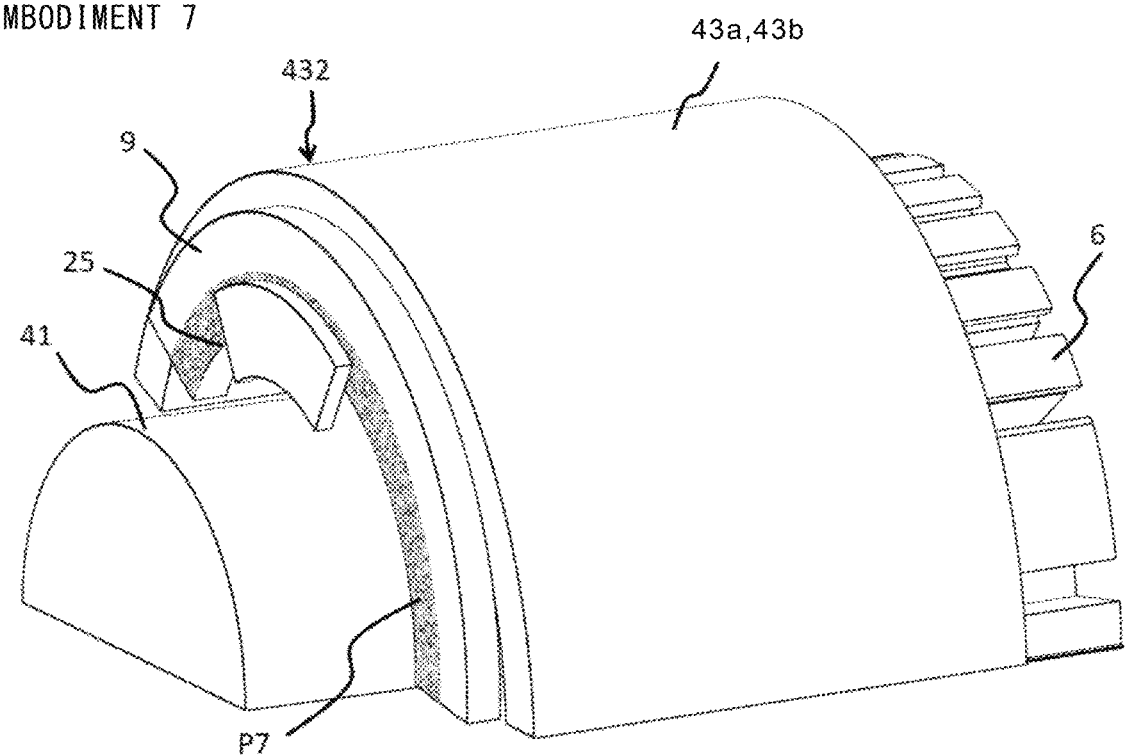
FIG. 17 is an external perspective view illustrating a test target portion in embodiment 7.

A rotating electric machine test method, a rotating electric machine test device, and a rotating electric machine according to embodiment 7 of the present invention will be described, focusing on a difference from the above embodiment 6. Embodiment 7 is different in test target portions from the above embodiment 6. FIG. 17 is an external perspective view illustrating a test target portion in embodiment 7. In embodiment 7, as shown in FIG. 17, an annular random pattern P7 about the axis of the rotary shaft 41 is formed on a surface of the end plate 9 perpendicular or substantially perpendicular to the axial direction (hereinafter, referred to as surface of the end plate 9). That is, the test target portion is set at the surface of the end plate 9.

Figure 18:
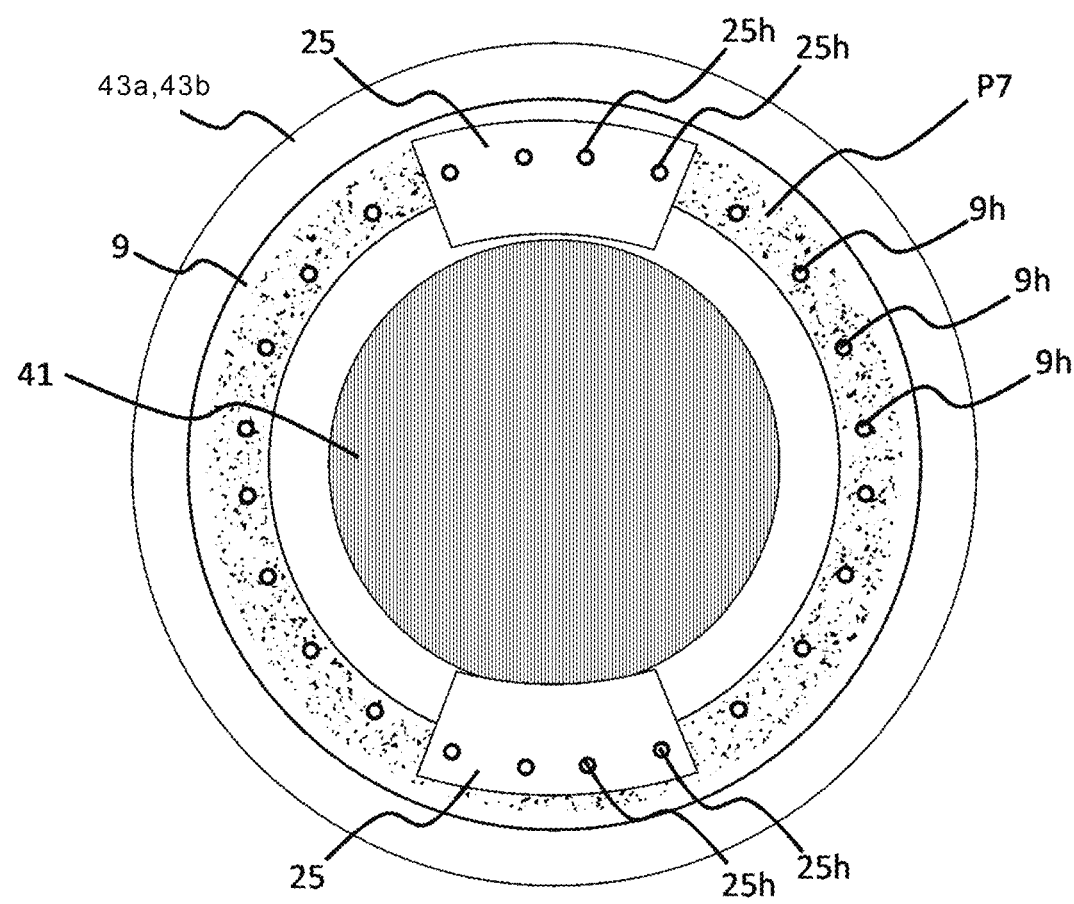
FIG. 18 is an axis perpendicular sectional view showing an end plate and the surrounding part thereof in embodiment 7.

FIG. 18 is an axis perpendicular sectional view showing the end plate 9 and the surrounding part thereof. As shown in FIG. 18, a pair of closing plates 25 are attached to the end plate 9 at positions symmetric with each other with respect to the axis of the rotary shaft 41. In the end plate 9, a plurality of screw holes 9h are formed at equal angle intervals over the entire range in the circumferential direction. A plurality of screw holes 25h corresponding to some of the plurality of screw holes 9h are formed in each closing plate 25. In a state in which the positions of the plurality of screw holes 25h are respectively matched with the positions of the corresponding screw holes 9h, screws (not shown) are screwed into the screw holes 9h through the screw holes 25h, whereby the closing plates 25 are fixed to the end plate 9.

The plurality of screw holes 9h of the end plate 9 include screw holes 9h (hereinafter, referred to as fixation screw holes 9h) for fixing the closing plates 25, and screw holes 9h (hereinafter, referred to as non-fixation screw holes 9h) not used for fixation of the closing plates 25. The non-fixation screw holes 9h are used in assembling of the rotating electric machine 100.

Figure 19:
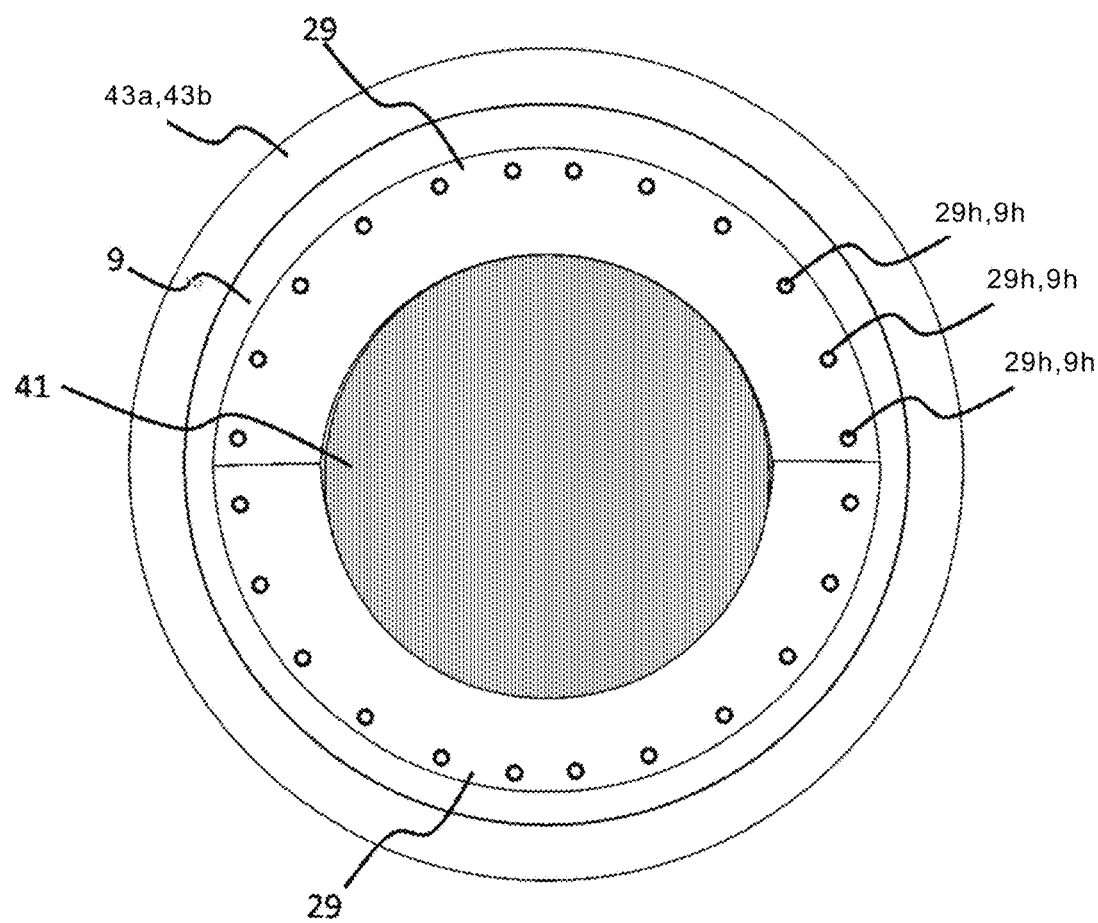
FIG. 19 is an axis perpendicular sectional view showing the end plate and the surrounding part thereof during assembling of a rotating electric machine.

FIG. 19 is an axis perpendicular sectional view showing the end plate 9 and the surrounding part thereof during assembling of the rotating electric machine 100. As shown in FIG. 19, during assembling of the rotating electric machine 100, before the closing plates 25 are attached to the end plate 9, a pair of provisional closing plates 29 having semi-annular shapes are temporarily attached to the end plate 9. Each provisional closing plate 29 has a plurality of screw holes 29h corresponding to a half number of screw holes 9h. In a state in which the positions of the plurality of screw holes 29h are respectively matched with the positions of the corresponding screw holes 9h, screws (not shown) are screwed into the screw holes 9h through the screw holes 29h, whereby the provisional closing plates 29 are fixed to the end plate 9. The non-fixation screw holes 9h are used for temporarily fixing the provisional closing plates 29, together with the fixation screw holes 9h. The pair of provisional closing plates 29 form an annular shape over the entire range in the circumferential direction on the end plate 9, and close the space between each retention ring 43a, 43b and the rotary shaft 41. Thus, during assembling, foreign materials such as dust and metal pieces are prevented from entering the inside of the retention rings 43a, 43b.

At the time of shrink fit between the end plate 9 and each retention ring 43a, 43b, a compressive force is applied around the plurality of screw holes 9h of the end plate 9. In addition, during operation of the rotating electric machine 100, a centrifugal force is applied around the plurality of screw holes 9h of the end plate 9. Thus, damage such as crack is likely to occur at the plurality of screw holes 9h and the surrounding part thereof in the end plate 9. Accordingly, in the present embodiment, the random pattern P7 is formed on a surface area of the end plate 9 around the plurality of screw holes 9h.

It is noted that the random pattern P7 may not necessarily be formed in areas (areas around the fixation screw holes 9h) of the end plate 9 that overlap the pair of closing plates 25. During operation of the rotating electric machine 100, damage is likely to be caused by a centrifugal force also around the screw holes 25h of the closing plates 25. Accordingly, random patterns may be formed in areas around the screw holes 25h of the closing plates 25.

The imaging devices 210a, 210b are provided at areas opposed to the surfaces of the end plates 9. In testing, in a state in which the rotor 4 is rotated at a low speed by the prime mover, the imaging devices 210a, 210b image the random patterns P7 around the plurality of screw holes 9h of the end plates 9 while the imaging devices 210a, 210b are moved in the radial direction by the driving mechanisms 211a, 211b. In the case where, in the radial direction, the random pattern P7 is within the field of view of imaging by each imaging device 210a, 210b, it is possible to image the test target portions without moving the imaging devices 210a, 210b in the radial direction. Thus, the driving mechanisms 211a, 211b are not needed.

Figure 20:
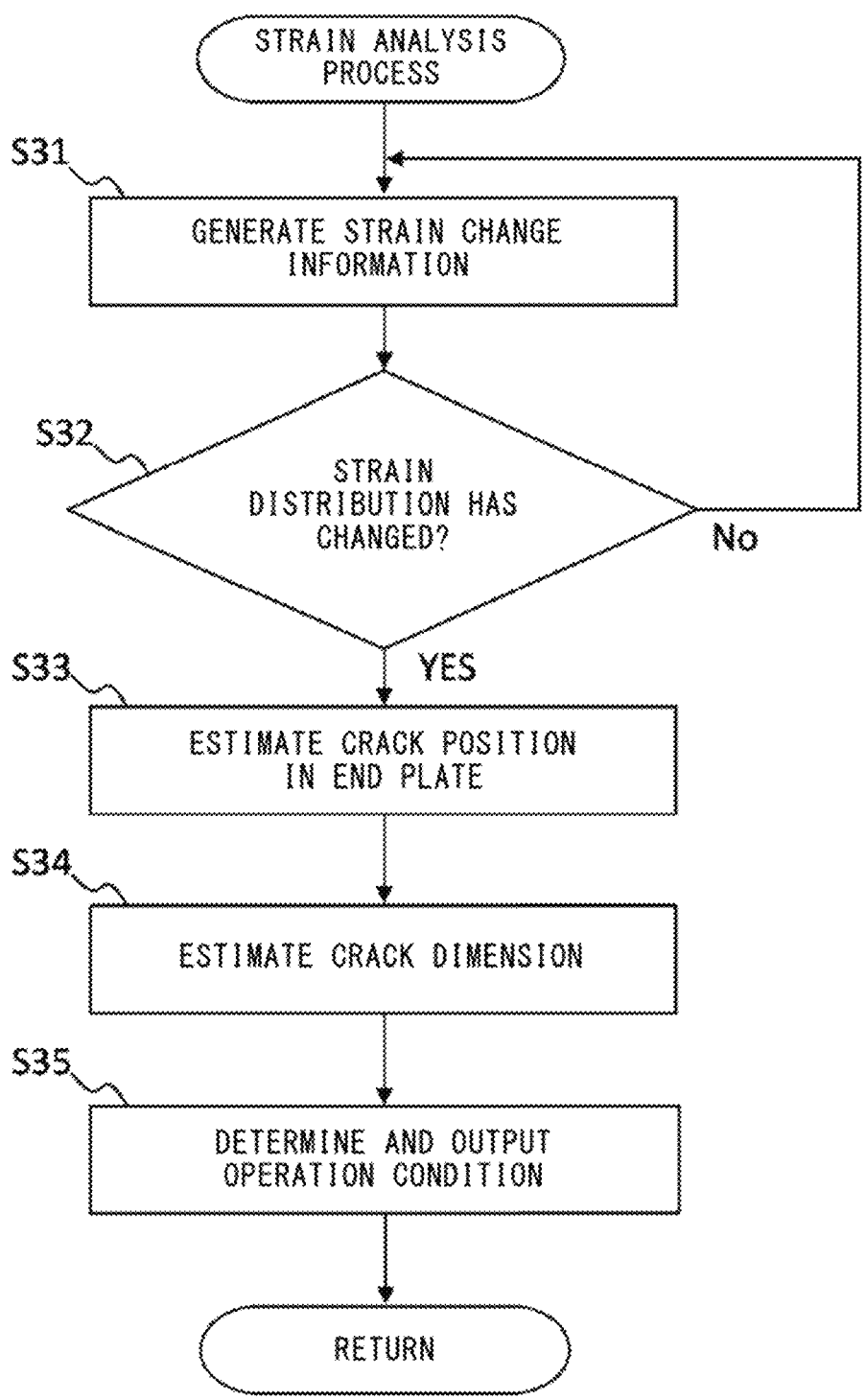
FIG. 20 is a flowchart showing a strain analysis process in embodiment 7.

Operation of the test device 200 in embodiment 7 will be described, focusing on a difference from the above embodiment 1. Embodiment 7 is different in the strain analysis process from embodiment 1. FIG. 20 is a flowchart showing the strain analysis process in embodiment 7. In this example, the tendency information stored in the tendency information storage unit 226 includes sixth distribution information. The sixth distribution information represents the strain distribution in the test target portion of the end plate 9 in the case where crack has occurred in the end plate 9.

As shown in FIG. 20, in step S31, the strain change information generation unit 225 generates strain change information on the basis of the initial image data stored in the image data storage unit 223 and the test image data acquired by the image data acquisition unit 222. In step S32, the crack position estimation unit 228 determines whether or not the strain distribution in the test target portion has changed from that in the initial period, on the basis of the strain change information generated in step S31.

If the strain distribution in the test target portion has changed, the process proceeds to step S33, and otherwise, the process returns to step S31. In step S33, the crack position estimation unit 228 estimates the crack position in the end plate 9 through inverse analysis of digital image correlation on the basis of the strain change information and the sixth distribution information. Further, in step S34, the crack dimension estimation unit 229 estimates the crack dimension in the end plate 9 through inverse analysis of digital image correlation on the basis of the strain change information and the sixth distribution information, and then the process proceeds to step S35.

In step S35, the operation condition determination unit 231 determines an appropriate operation condition (operation possible time and appropriate speed) by a known method based on material property and fracture mechanics, on the basis of the estimated crack position and crack dimension, and outputs the determined operation condition to the display device 240.

Thus, the display device 240 displays the operation condition given from the operation condition determination unit 231. The worker adjusts the rotation speed of the rotor 4 to the appropriate speed on the basis of the display of the display device 240, whereby it is possible to prolong the life of the rotating electric machine 100. In addition, the worker can perform repair or part replacement at an appropriate timing on the basis of the displayed operation possible time.

As described above, in embodiment 7, the random pattern P7 around the screw holes 9h of each end plate 9 is imaged as the test target portion, and on the basis of the generated test image data, strain change information representing change in the strain distribution around the screw holes 9h of each end plate 9 is generated by digital image correlation. Thus, the states of the end plates 9 can be efficiently tested.

The ranges of imaging by the imaging devices 210a, 210b are limited to the surface areas of the end plates 9. Therefore, the times of imaging by the imaging devices 210a, 210b can be shortened. In addition, the configuration of the driving mechanisms 211a, 211b can be simplified.

EMBODIMENT 8

Figure 21:
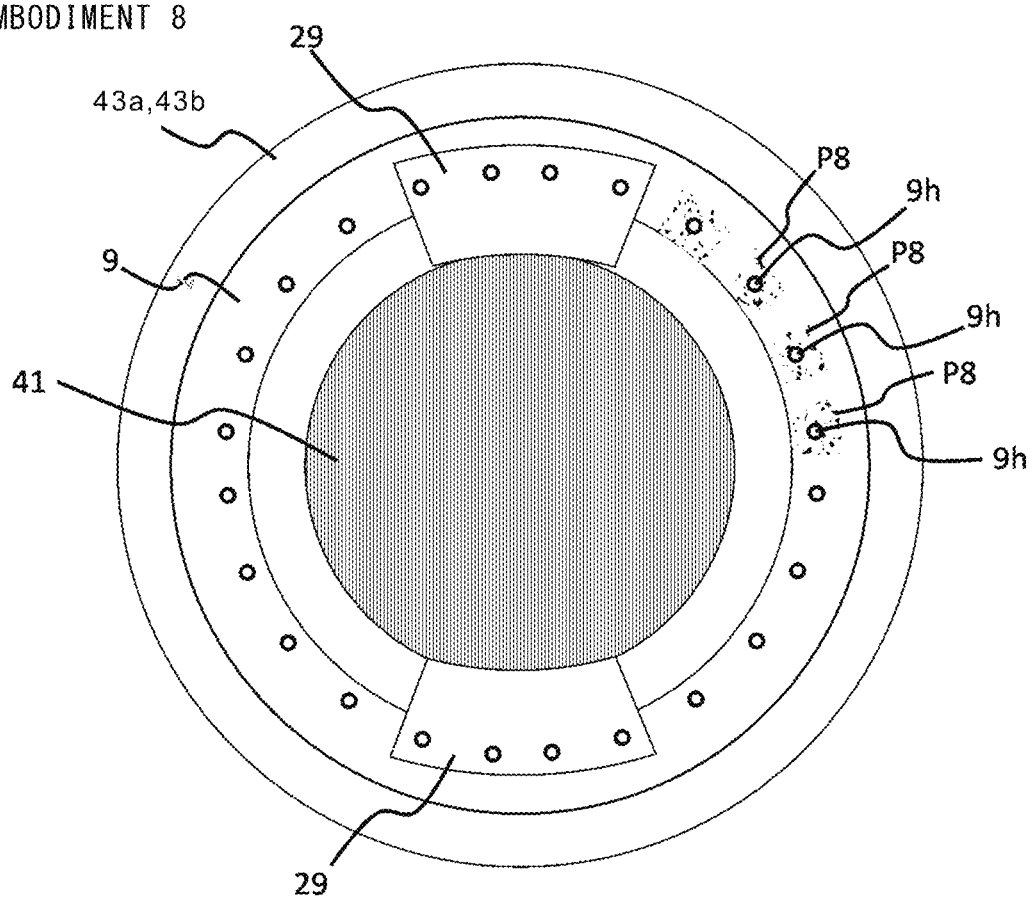
FIG. 21 is an axis perpendicular sectional view illustrating test target portions in embodiment 8.

A rotating electric machine test method, a rotating electric machine test device, and a rotating electric machine according to embodiment 8 of the present invention will be described, focusing on a difference from the above embodiment 7. Embodiment 8 is different in test target portions from the above embodiment 7. FIG. 21 is an axis perpendicular sectional view illustrating test target portions in embodiment 8. In embodiment 8, as shown in FIG. 21, a plurality of random patterns P8 respectively corresponding to the plurality of screw holes 9h are formed so as to be arranged in the circumferential direction. That is, a plurality of test target portions respectively corresponding to the plurality of screw holes 9h are set so as to be arranged in the circumferential direction. The screw holes 9h are each located within the corresponding random pattern P8.

In embodiment 8, the random patterns P8 around the screw holes 9h of the end plate 9 are imaged as the test target portions, and on the basis of the generated test image data, strain change information representing change in the strain distribution around the screw holes 9h of the end plate 9 is generated by digital image correlation. Thus, the state of the end plate 9 can be efficiently tested.

The ranges of imaging by the imaging devices 210a, 210b are limited to the areas around the screw holes 9h of the end plates 9. Therefore, the times of imaging by the imaging devices 210a, 210b can be shortened.

OTHER EMBODIMENTS

The random patterns P1 to P8 in the above embodiments may be formed by pasting or may be formed by projection. The random patterns P1 to P8 may be formed as recesses/ protrusions, instead of color differences. Alternatively, patterns naturally appearing on the outer circumferential surfaces of the retention rings 43a, 43b may be utilized as the random patterns P1 to P8.

The random patterns P1 to P8 may be formed in manufacturing of the rotating electric machine 100, may be formed after the rotating electric machine 100 is manufactured and before start of the operation, or may be formed after the operation of the rotating electric machine 100 is started. In the case where the random patterns P1 to P8 are formed after the operation of the rotating electric machine 100 is started, it is preferable to acquire the initial image data at the time of the formation.

In the above embodiments, the retention rings 43a, 43b and the rotor core 42 are joined to each other by shrink fit. However, the retention rings 43a, 43b and the rotor core 42 may be joined to each other by another method such as welding. Similarly, in the above embodiment, the retention rings 43a, 43b and the end plates 9 are joined to each other by shrink fit. However, the retention rings 43a, 43b and the end plates 9 may be joined to each other by another method such as welding.

In the above embodiments, the initial image data are acquired by the imaging devices 210a, 210b imaging the test target portions in the initial period. However, default initial image data may be prepared in advance. In this case, it becomes unnecessary to image the test target portions in the initial period.

In the above embodiments, the test target portions are imaged by the imaging devices 210a, 210b while the rotor 4 is rotated at a low speed by the prime mover. Instead, the test target portions may be imaged while the imaging devices 210a, 210b are moved in the circumferential direction by the driving mechanisms 211a, 211b, in a state in which the rotor 4 is stopped. Alternatively, the test target portions may be imaged while the rotor 4 is rotated by another rotating device other than a prime mover. In these cases, it is possible to image the entire test target portions without running the prime mover.

The test target portions may be imaged by the imaging devices 210a, 210b during operation of the rotating electric machine 100. In this case, strain occurring during rotation of the rotor 4 can be detected. For example, in the case where short-circuit has occurred in the rotating electric machine 100, the rotor 4 is rotated at an extremely high speed, so that a great centrifugal force is applied to the intermediate portions of the retention rings 43a, 43b and the strain distributions are changed. It becomes possible to detect such change in the strain distribution due to the centrifugal force as described above.

Two or more of the test methods according to the above embodiments 1 to 8 may be combined. For example, the test method according to embodiment 2 and the test method according to embodiment 4 may be combined and thus the test target portions may be set at the core-side ends 431 and the plate-side ends 432 of the retention rings 43a, 43b. Alternatively, the test method according to embodiment 1 and the test method according to embodiment 7 may be combined and thus the test target portions may be set at the entire outer circumferential surfaces of the retention rings 43a, 43b and the surfaces of the end plates 9.

In the above embodiments, one imaging device is used for each of the retention rings 43a, 43b. However, a plurality of imaging devices may be used for each of the retention rings 43a, 43b. For example, in the case where a plurality of test target portions are set, different imaging devices may be used for the respective test target portions.

Figure 22:
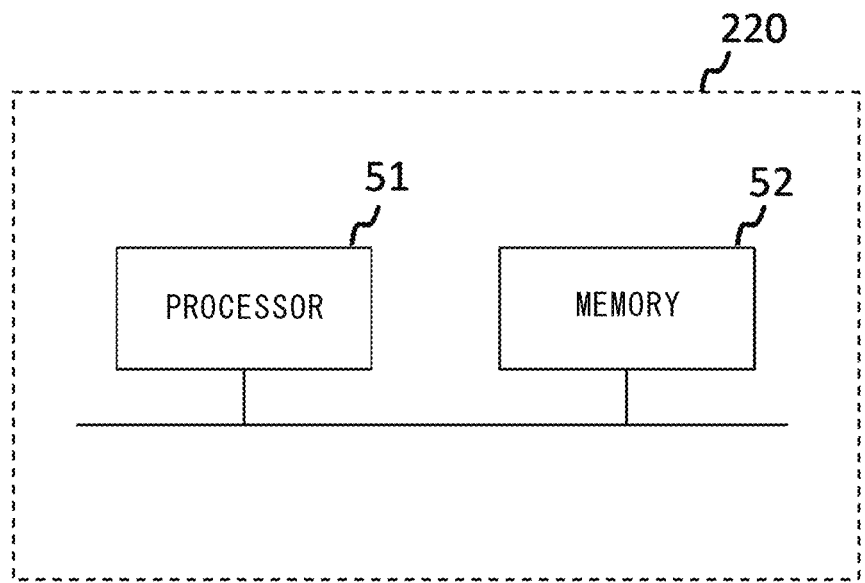
FIG. 22 is a diagram showing an example in which at least some of the functions of the image processing device are implemented by software.

The functions of the image processing device 220 may be implemented by hardware such as an electronic circuit, or may be implemented by software. FIG. 22 is a diagram showing an example in which at least some of the functions of the image processing device 220 are implemented by software. In the example in FIG. 22, the image processing device 220 includes a processing device (processor) 51 and a storage device (memory) 52. The processing device 51 is, for example, a central processing unit (CPU), and can implement at least some of the functions of the image processing device 220 in the above embodiments by reading and executing a program stored in the storage device 52. For example, the imaging control unit 221, the image data acquisition unit 222, the strain change information generation unit 225, the tendency information storage unit 226, the crack position estimation unit 228, the crack dimension estimation unit 229, and the operation condition determination unit 231 are implemented by the processing device 51, and the image data storage unit 223 and the tendency information storage unit 226 are implemented by the storage device 52.

The above embodiments have shown the example in which the present invention is applied to an electric generator that converts a rotational force to electric power. However, the present invention may be applied to a motor that converts electric power to a rotational force.

DESCRIPTION OF THE REFERENCE CHARACTERS 1 frame
2 gas cooler
3 stator
4 rotor
9 end plate
31 stator core
32 stator winding
41 rotary shaft
42 rotor core
43a, 43b retention ring
44A, 44B rotor winding
100 rotating electric machine
200 test device
210a, 210b imaging device
211a, 211b driving mechanism
220 image processing device
221 imaging control unit
222 image data acquisition unit
223 image data storage unit
225 strain change information generation unit
226 tendency information storage unit
228 crack position estimation unit
229 crack dimension estimation unit
231 operation condition determination unit
240 display device
421 magnetic pole portion
422 air passage
423 slot
424 coming-off prevention portion
431 core-side end
432 plate-side end

The invention claimed is:

1. A rotating electric machine test method for testing a rotating electric machine including a rotor and a stator, the rotating electric machine test method comprising:
acquiring test image data by imaging a test target portion which is a part of the rotor by an imager;

generating, as strain change information, change in a strain distribution in the test target portion by digital image correlation based on the acquired test image data; and determining a time during which operation of the rotating electric machine is able to continue, based on the strain change information.

2. The rotating electric machine test method according to claim 1, further comprising acquiring initial image data by imaging the test target portion in a first period, wherein said acquiring the test image data includes acquiring the test image data by imaging the test target portion in a second period after the first period, and said generating the change in the strain distribution includes generating the strain change information based on the initial image data and the test image data.

3. The rotating electric machine test method according to claim 1, further comprising determining an appropriate value of a rotation speed of the rotor of the rotating electric machine based on the strain change information.

4. The rotating electric machine test method according to claim 1, wherein said acquiring the test image data includes imaging the test target portion by the imager while rotating the rotor.

5. The rotating electric machine test method according to claim 1, wherein the rotor includes a rotor core extending in an axial direction and storing a winding, and a retention ring attached to an attachment portion provided at an end in the axial direction of the rotor core, the retention ring retaining the winding, and the test target portion is provided at the retention ring.

6. The rotating electric machine test method according to claim 5, wherein the test target portion includes a part of the retention ring that overlaps the attachment portion in a radial direction perpendicular to the axial direction.

7. The rotating electric machine test method according to claim 5, wherein the rotor core has a groove-shaped air passage into which gas is introduced, and the test target portion is provided at a part of the retention ring that overlaps the air passage in a radial direction perpendicular to the axial direction.

8. The rotating electric machine test method according to claim 5, wherein the rotor core has a plurality of groove-shaped slots formed with intervals from each other in a circumferential direction about the axial direction, and the test target portion is provided at a plurality of parts of the retention ring that overlap the plurality of slots in a radial direction perpendicular to the axial direction.

9. The rotating electric machine test method according to claim 1, wherein the rotor includes a rotor core extending in an axial direction and storing a winding, a retention ring attached to an attachment portion provided at an end in the axial direction of the rotor core, the retention ring retaining the winding, and an end plate attached to the retention ring, the retention ring has first and second ends, the first end is attached to the attachment portion, and the end plate is attached to the second end, and the test target portion is provided at the end plate.

10. The rotating electric machine test method according to claim 5, further comprising estimating a position of crack occurring in the rotor, based on the strain change information and tendency information representing tendency of the strain distribution in the test target portion in a case where crack has occurred in the rotor.

11. The rotating electric machine test method according to claim 10, wherein the tendency information includes first distribution information representing the strain distribution in a case where crack has occurred in the retention ring, and second distribution information representing the strain distribution in a case where crack has occurred in the rotor core, and said estimating the position of crack further includes estimating a position of crack occurring in the retention ring and the rotor core, based on the strain change information and the first and second distribution information.

12. The rotating electric machine test method according to claim 10, further comprising estimating a dimension of crack occurring at the position estimated in said estimating the position of the crack, based on the strain change information.

13. A rotating electric machine test device for testing a rotating electric machine including a rotor and a stator, the rotating electric machine test device comprising:

an imager to acquire test image data by imaging a test target portion which is a part of the rotor; and a change information generator to generate strain change information representing change in a strain distribution in the test target portion by digital image correlation based on the test image data acquired by the imager, wherein the rotor includes a rotor core extending in an axial direction and storing a winding, and a retention ring attached to an attachment portion provided at an end in the axial direction of the rotor core, the retention ring retaining the winding, and the test target portion is provided at the retention ring.

14. A rotating electric machine comprising a rotor and a stator, wherein the rotor includes;

a rotor core extending in an axial direction and storing a winding, a retention ring attached to an attachment portion provided at an end in the axial direction of the rotor core, the retention ring retaining the winding, and an end plate attached to the retention ring, and the retention ring or the end plate has a random pattern formed thereon for generating, as strain change information, change in a strain distribution by digital image correlation.

15. The rotating electric machine according to claim 14, wherein the retention ring has first and second ends, the first end is attached to the attachment portion, and the end plate is attached to the second end.

* * * * *